(12) United States Patent
Zhu

(10) Patent No.: US 11,616,150 B2
(45) Date of Patent: Mar. 28, 2023

(54) SEMICONDUCTOR DEVICE WITH C-SHAPED CHANNEL PORTION AND ELECTRONIC APPARATUS INCLUDING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 135 days.

(21) Appl. No.: 17/153,839

(22) Filed: Jan. 20, 2021

(65) Prior Publication Data

US 2021/0226069 A1 Jul. 22, 2021

(30) Foreign Application Priority Data

Jan. 21, 2020 (CN) .......................... 202010072949.8

(51) Int. Cl.
*H01L 29/786* (2006.01)
*H01L 29/06* (2006.01)
(Continued)

(52) U.S. Cl.
CPC .................. *H01L 29/78696* (2013.01); *H01L 21/823807* (2013.01); *H01L 27/092* (2013.01);
(Continued)

(58) Field of Classification Search
CPC ....... H01L 29/78696; H01L 21/823807; H01L 27/092; H01L 29/0676; H01L 29/401; H01L 29/41733; H01L 29/41775; H01L 29/42392; H01L 29/66439; H01L 29/66742; H01L 29/775; H01L 29/0692; H01L 21/823885; H01L 29/0847; H01L 29/1037; H01L 29/42376; H01L 29/66545; H01L 29/66666; H01L 29/7827; H01L 27/0924; H01L 27/0928; H01L 29/0665;
(Continued)

(56) References Cited

U.S. PATENT DOCUMENTS

2007/0246783 A1* 10/2007 Moon .................. H01L 29/1037
257/E21.627
2011/0012085 A1* 1/2011 Deligianni ........ H01L 29/78642
257/E21.409

* cited by examiner

*Primary Examiner* — Tong-Ho Kim
(74) *Attorney, Agent, or Firm* — Hamre, Schumann, Mueller & Larson, P.C.

(57) ABSTRACT

A semiconductor device with C-shaped channel portion and an electronic apparatus including the semiconductor device are disclosed. According to the embodiments, the semiconductor device may include a first semiconductor element and a second semiconductor element adjacent in a first direction. The first semiconductor element and the second semiconductor element may respectively include: a channel portion on a substrate, the channel portion including a curved nano-sheet or nano-wire with a C-shaped section; source/drain portions at upper and lower ends of the channel portion with respect to the substrate, respectively; and a gate stack surrounding a periphery of the channel portion. The channel portion of the first semiconductor element and the channel portion of the second semiconductor element may be substantially coplanar.

36 Claims, 23 Drawing Sheets

(51) Int. Cl.
    *H01L 29/775*     (2006.01)
    *H01L 27/092*     (2006.01)
    *H01L 29/417*     (2006.01)
    *H01L 29/423*     (2006.01)
    *H01L 29/40*     (2006.01)
    *H01L 29/66*     (2006.01)
    *H01L 21/8238*     (2006.01)

(52) U.S. Cl.
    CPC ........ *H01L 29/0676* (2013.01); *H01L 29/401* (2013.01); *H01L 29/41733* (2013.01); *H01L 29/41775* (2013.01); *H01L 29/42392* (2013.01); *H01L 29/66439* (2013.01); *H01L 29/66742* (2013.01); *H01L 29/775* (2013.01)

(58) Field of Classification Search
    CPC . H01L 29/0669; H01L 29/1033; B82Y 10/00; B82Y 40/00
    USPC ........................................................ 257/288
    See application file for complete search history.

SEMICONDUCTOR DEVICE WITH C-SHAPED CHANNEL PORTION AND ELECTRONIC APPARATUS INCLUDING THE SAME

CROSS-REFERENCE TO RELATED APPLICATION

This application claims the benefit of Chinese Patent Application No. 202010072949.8 filed on Jan. 21, 2020 in the China National Intellectual Property Office, the whole disclosure of which is incorporated herein by reference.

TECHNICAL FIELD

The present disclosure relates to the field of semiconductors, and in particular, to a semiconductor device with a C-shaped nano-sheet or nano-wire channel portion, and an electronic apparatus including the semiconductor device.

BACKGROUND

With the constant minimization of semiconductor elements, devices with various structures such as FinFET, MBCFET, etc. are proposed. However, in aspects of enhancing integrity density and device performance, an improving space for these devices may still not meet requirements due to limitations in the device structures.

In addition, due to process fluctuations such as photolithography and etching, it is difficult for a vertical nano-sheet or nano-wire device such as a metal oxide semiconductor field effect transistor (MOSFET) to control a thickness or diameter of the nano-sheet or nano-wire.

SUMMARY

In view of this, at least a part of embodiments of the present disclosure provide a semiconductor device with a C-shaped nano-sheet or nano-wire channel portion and a manufacturing method thereof, and an electronic apparatus including the semiconductor device.

According to one aspect of the present disclosure, a semiconductor device is provided, including a first semiconductor element and a second semiconductor element adjacent in a first direction. The first semiconductor element and the second semiconductor element respectively include: a channel portion on a substrate, the channel portion including a curved nano-sheet or nano-wire with a C-shaped section; drain/source portions on upper and lower ends of the channel portion relative to the substrate; and a gate stack surrounding a periphery of the channel portion. The channel portion of the first semiconductor element and the channel portion of the second semiconductor element are substantially coplanar.

According to another aspect of the present disclosure, an electronic apparatus is provided, including the above-mentioned semiconductor device.

According to embodiments of the present disclosure, a semiconductor device with a new structure is provided, which may have advantages of high performance and high density.

BRIEF DESCRIPTION OF THE DRAWINGS

The aforementioned and other purposes, features and advantages of the present disclosure will become more apparent through description below to the embodiments of the present disclosure with reference to the drawing, in the drawings:

FIGS. 1-25(b) schematically show some stages of a process of manufacturing a semiconductor element according to the embodiments of the present disclosure;

FIGS. 27-29(b) schematically show some stages of the process of manufacturing a semiconductor element according to another embodiment of the present disclosure;

wherein, FIGS. 5(a), 6(a), 18(a), 19, 20(a), 22(a), 23, 24, 25(a), 26-28, 29(a), 30, 31 are plan views;

FIGS. 1-4, 5(b), 6(b), 7-13, 14 (a), 14 (b), 15, 16 (a), 17, 18 (b), 20 (b), 21, 22 (b), 25 (b), 29 (b) are sectional views along AA' line;

Throughout the drawings, the same or similar reference numerals indicate the same or similar components.

DETAILED DESCRIPTION OF EMBODIMENTS

Figure 1:
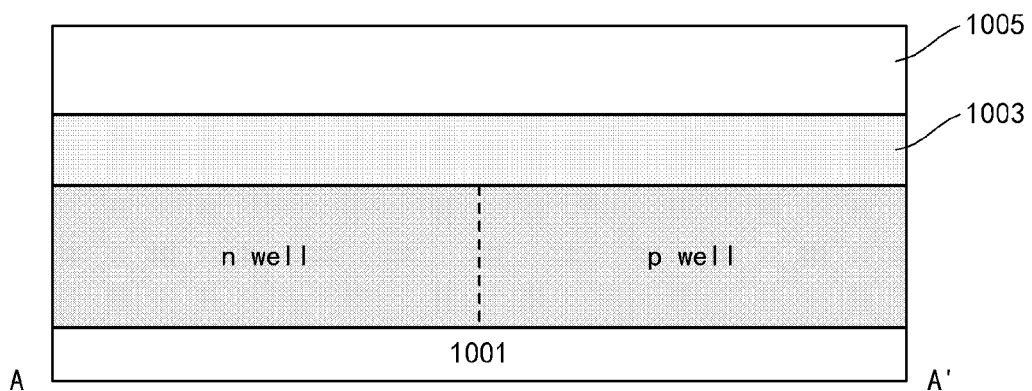

In the following, the embodiments of the present disclosure will be described with reference to the drawings. However, it should be understood that, these descriptions are illustrative, and are not intended to limit the scope of the present disclosure. In addition, in the following specification, the description to known structures and techniques are omitted to avoid unnecessary confusion with the concept of the present disclosure.

In the drawings, various schematic structural views according to the embodiments of the present disclosure are shown, wherein, for the purpose of clarity, some details are enlarged, and some details may be omitted. Shapes of various areas and layers shown in the drawings and relative sizes, positional relationships among them are only illustrative, which may be deviated in practical due to manufacturing tolerances or technical limitations, and those skilled in the art may additionally design areas/layers of different shapes, sizes, relative positions according to actual needs.

In the context of the present disclosure, when a layer/element is referred to being "on" another layer/element, the layer/element may be directly on another layer/element, or there may be an intermediate layer/element between them. In addition, if a layer/element is on another layer/element in one orientation, the layer/element may be "under" another layer/element when the orientation is reversed.

According to the embodiments of the present disclosure, a semiconductor device is provided, including a first semiconductor element and a second semiconductor element adjacent in a first direction. Each of the first semiconductor element and the second semiconductor element may be a vertical semiconductor element with an active area that is disposed vertically (for example, in a direction substantially perpendicular to a surface of the substrate) on a substrate. A channel portion may be a curved nano-sheet or nano-wire with a C-shaped section (for example, a section perpendicular to a surface of the substrate), thus, the element may be referred to as a C-Channel Field Effect Transistor, that is, CCFET. The first semiconductor element and the second semiconductor element may form a complementary configuration, therefore the semiconductor device may be referred to as a complementary CCFET, that is, C3FET. As described below, the nano-sheet or nano-wire may be formed through epitaxial growth, thus, it may be a single piece as an integrity with a substantially uniform thickness.

As described below, the respective channel portions of the first semiconductor element and the second semiconductor element may be defined by the same material layer, thus, they may be substantially coplanar (for example, upper surfaces are substantially coplanar and/or lower surfaces are substantially coplanar).

The first semiconductor element and the second semiconductor element may further include a source/drain portion at upper and lower ends of the channel portion, respectively. As described below, source/drain portions of the first semiconductor element and the second semiconductor element may be defined by the same material layer, thus, they may be substantially coplanar (for example, the upper surfaces are substantially coplanar and/or the lower surfaces are substantially coplanar). A size of the source/drain portion in a transverse direction relative to a substrate may be larger than a size of the channel portion in a corresponding direction, so as to ensure the upper and lower ends of the channel portion connect with the source/drain portion. The source/drain portion may have a certain doping. For example, for a p-type element, the source/drain portion may have a p-type doping; for an n-type element, the source/drain portion may have an n-type doping. The channel portion may have a certain doping to adjust a threshold voltage of the element. Alternatively, the semiconductor element may be a non-junction element, wherein the channel portion and the source/drain portion may have doping of the same conductive type. Alternatively, the semiconductor element may be a tunneling type element, wherein the source/drain portion at two ends of the channel portion may have doping types opposite to each other.

The source/drain portion may be disposed in the corresponding semiconductor layer. For example, the source/drain portion may be a doping area in the corresponding semiconductor layer. The source/drain portion may be a part or all of the corresponding semiconductor layer. In the case that the source/drain portion is a part of the corresponding semiconductor layer, there may be a doping concentration interface between the source/drain portion and other portions of the corresponding semiconductor layer. As described below, the source/drain portion may be formed through diffusion doping. In this case, the doping concentration interface may be substantially in a vertical direction relative to the substrate.

The channel portion may include a single crystal semiconductor material. Of course, the source/drain portion or the semiconductor layer where the source/drain portion is formed may further include a single crystal semiconductor material. For example, they may be formed through epitaxial growth.

The semiconductor element may further include a gate stack surrounding a periphery of the channel portion. Thus, the semiconductor element according to the embodiments of the present disclosure may be a surrounding gate element. According to the embodiments of the present disclosure, the gate stack may be self-aligned with the channel portion. For example, at least a part of the gate stack adjacent to the channel portion and the channel portion may be substantially coplanar, for example, the part of the gate stack and the upper surface and/or the lower surface of the channel portion are substantially coplanar.

For example, the semiconductor element may be manufactured as below.

According to the embodiments, a stack of a first material layer, a second material layer and a third material layer may be disposed on the substrate. The first material layer may define a position of the lower source/drain portion, the second material layer may define a position of the gate stack, and the third material layer may define a position of the upper source/drain portion. The first material layer may be provided by the substrate, such as an upper portion of the substrate. The second material layer and the third material layer may be formed in sequence on the first material layer through epitaxial growth. Alternatively, the first material layer, the second material layer and the third material layer may be formed in sequence on the substrate through for example, epitaxial growth. The first material layer and the third material layer may be doped in situ while grown epitaxially to form the source/drain portions therein.

The stack may be patterned to be a ridge-like structure. The ridge-like structure may include a first side and a second side opposite to each other, and a third side and a fourth side opposite to each other. For example, the ridge-like structure may be quadrilateral in a plan view, such as rectangle or square. The channel portion may be formed on two opposite sidewalls (for example, the first side and the second side) of the ridge-like structure.

To form the gate stack surrounding the channel portion subsequently, a space for forming the gate stack may be defined on the third side and the fourth side of the ridge-like structure. For example, the sidewalls of the second material layer on the third side and the fourth side of the ridge-like structure may be concaved transversely relative to the first material layer and the third material layer to define a first concave portion. The first concave portion may have a curved surface concaved toward an inner side of the ridge-like structure. A first placeholder layer may be formed in the first concave portion.

Similarly, the sidewalls of the second material layer on the first side and the second side of the ridge-like structure may be concaved transversely relative to the first material layer and the third material layer to define a second concave portion, to define a space for the gate stack. The second concave portion may have a curved surface concaved toward the inner side of the ridge-like structure. The channel portion may be formed on a surface of the second concave portion. For example, a first active layer may be formed through epitaxial growth on an exposed surface of the ridge-like structure. A part of the first active layer on the surface of the second concave portion may be served as the channel portion (which may also be referred to as "channel layer"). Based on the first active layer on sidewalls of the first side and the second side of the ridge-like structure, elements may be formed, respectively. Therefore, two elements opposite to each other, for example, the first semiconductor element and the second semiconductor element as described above may be formed based on a single ridge-like structure. A second placeholder layer may be formed in the second concave portion with the channel layer formed on the surface thereof.

After the second concave portion is defined and before the first active layer is formed, the exposed surface of the ridge-like structure may be etched back for a certain amount, for example, which is substantially equal to a thickness of the first active layer to be formed. This is beneficial for ensuring the gate stacks formed subsequently have substantially equal gate lengths on two opposite sides of the channel portion.

The source/drain portions may be formed in the first material layer and the third material layer. For example, the source/drain portions may be formed by doping the first material layer and the third material layer (in particular in the case that they are not doped when being formed). The doping may be realized by a solid phase dopant source layer.

An opening may be formed in the ridge-like structure to separate the active areas of two elements. The opening may extend substantially along the sidewalls of the first side or the second side of the ridge-like structure, so that the ridge-like structure is divided into two portions on the first side and the second side, respectively. The two portions have channel layers, respectively. The second material layer may be replaced with a third placeholder layer through the opening.

Currently, the channel portion is surrounded by the first placeholder layer, the second placeholder layer and the third placeholder layer. The first placeholder layer, the second placeholder layer and the third placeholder layer may be replaced with the gate stack through a replacement gate process so as to form the gate stack surrounding the channel portion.

According to the embodiments of the present disclosure, the thickness of the nano-sheet or nano-wire served as the channel portion and the gate length are mainly determined by epitaxial growth, rather than etching or photolithography, thus, it may have good channel size/thickness and gate length control.

The present disclosure may be realized in various forms, some examples of which will be described below. In the following description, a selection of various materials is involved. In addition to considering functions thereof (for example, a semiconductor material for forming the active area, a dielectric material for forming electrical isolation), the selection of material further considers etching selectivity. In the following description, the etching selectivity needed may be stated, and may not be stated. Those skilled in the art should understand that when etching a certain material layer is mentioned below, if it is not mentioned that other layers are etched as well or the drawings do not show that other layers are etched, the etching is selective, and the material layer has etching selectivity relative to other layers exposed in the same etching recipe.

FIGS. 1-25 (b) schematically show some stages of a process of manufacturing the semiconductor element according to the embodiments of the present disclosure.

As shown in FIG. 1, a substrate 1001 (an upper portion thereof may constitute the first material layer described above) is provided. The substrate 1001 may be a substrate of various forms, including but not limited to a bulk semiconductor material substrate such as a bulk Si substrate, a semiconductor-on-insulator (SOI) substrate, a compound semiconductor substrate such as a SiGe substrate, etc. In the following description, for convenience of specification, a bulk Si substrate is taken as an example for description. Here, a silicon wafer is provided as the substrate 1001.

In the substrate 1001, a well region may be formed. If a p-type element is to be formed, the well region may be an n-type well; if an n-type element is to be formed, the well region may be a p-type well. For example, the well region may be formed by injecting a dopant (a p-type dopant such as B or In, or an n-type dopant such as As or P) of a corresponding conductivity type into the substrate 1001 and then thermal annealing. The well region may be provided in a plurality of ways in the art, which will not be repeated herein.

In the example, forming the p-type element and the n-type element simultaneously is taken as the example for description, and the p-type element and the n-type element are adjacent to each other (then a complementary metal oxide semiconductor (CMOS) configuration may be formed), thus, the abutting n-type well and p-type well are formed. However, the present disclosure is not limited to this. For example, elements of the same conductivity type may be formed. Alternatively, elements of different conductivity types may be formed, wherein the p-type element is formed in an area, and the n-type element is formed in another area.

In the substrate 1001, the second material layer 1003 and the third material layer 1005 may be formed by, for example, epitaxial growth. The second material layer 1003 may be configured to define a position of the gate stack, a thickness of which is, for example, about 20 nm-50 nm. The third material layer 1005 may be configured to define a position of an upper end source/drain portion, and a thickness of which is, for example, about 20 nm-200 nm.

Adjacent ones among the substrate 1001 and various layers formed above may have etching selectivity relative to each other. For example, in the case that the substrate 1001 is a silicon wafer, the second material layer 1003 may include SiGe (for example, an atom percentage of Ge is about 10%-30%), and the third material layer 1005 may include Si.

Figure 2:
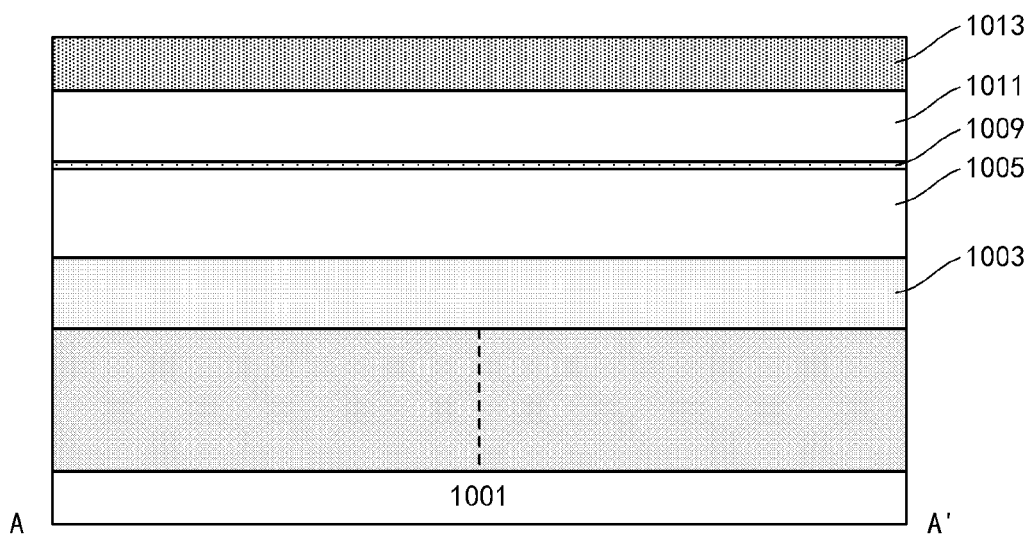

According to the embodiments, spacer pattern transfer technology is used in the following patterning process. In order to form a spacer, a mandrel pattern may be formed. For example, as shown in FIG. 2, a layer 1011 for the mandrel pattern may be formed by, for example, deposition on the third material layer 1005. For example, the layer 1011 for the mandrel pattern may include amorphous silicon or polysilicon, a thickness of which is about 50 nm-150 nm. In addition, for a better etching control, an etching stop layer 1009 may be formed firstly by, for example, deposition. For example, the etching stop layer 1009 may include oxide (for example, silicon oxide), a thickness of which is about 1 nm-10 nm.

On the layer 1011 for the mandrel pattern, a hard mask layer 1013 may be formed by, for example, deposition. For example, the hard mask layer 1013 may include nitride (for example, silicon nitride), a thickness of which is about 30 nm-100 nm.

The layer 1011 for the mandrel pattern may be patterned into the mandrel pattern.

Figure 3:
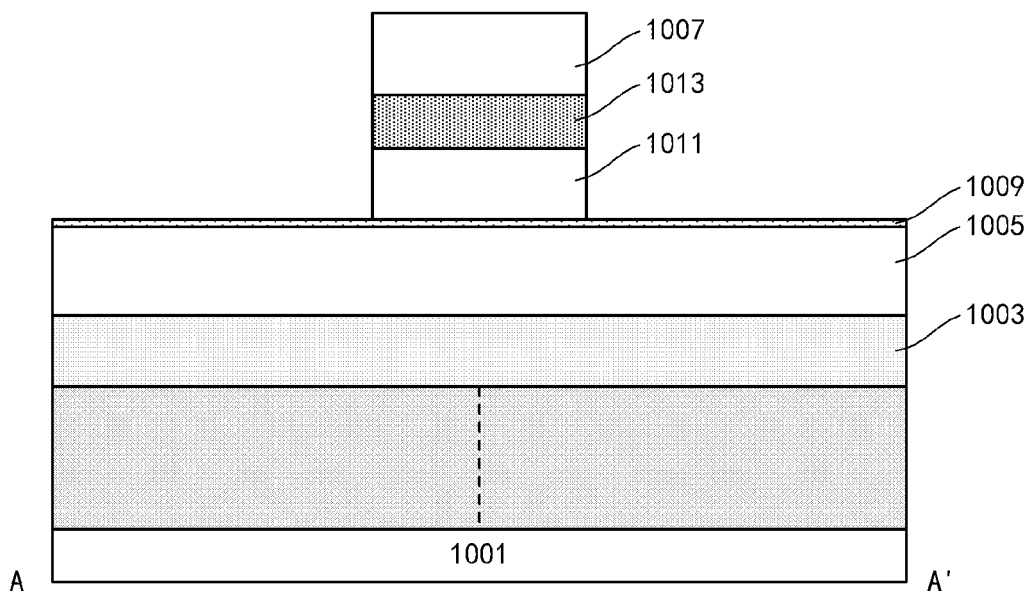

For example, as shown in FIG. 3, a photoresist 1007 may be formed on the hard mask layer 1013, and it is patterned to be a stripe extending in a first direction (a direction perpendicular to the paper surface in FIG. 3) through photolithography. The photoresist 1007 may be served as an etching mask, then the hard mask layer 1013 and the layer 1011 for the mandrel pattern are selectively etched in sequence through, for example, reaction ion etching (RIE), to transfer the pattern of the photoresist to the hard mask layer 1013 and the layer 1011 for the mandrel pattern. The etching may be stopped at the etching stop layer 1009. Then, the photoresist 1007 may be removed.

Figure 4:
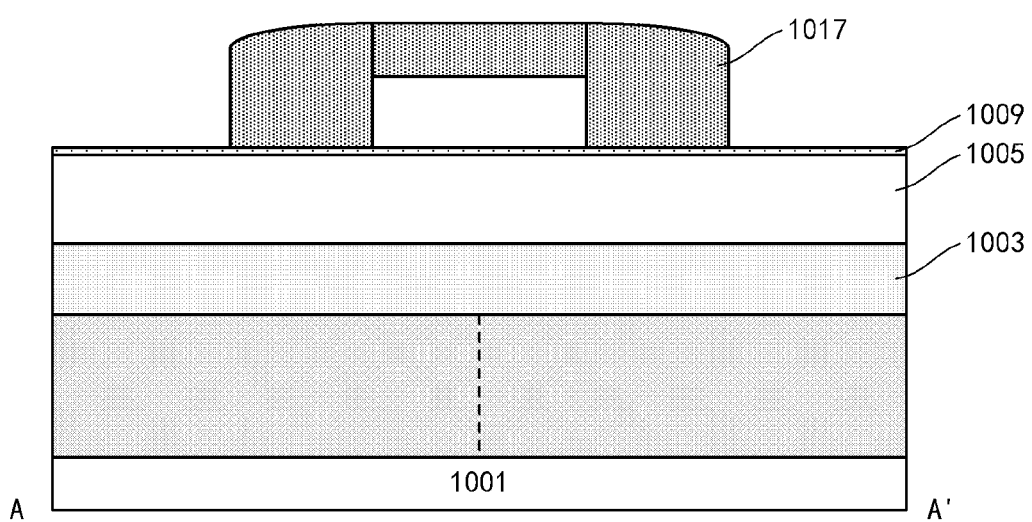

As shown in FIG. 4, the spacer 1017 may be formed on sidewalls at two opposite sides of the mandrel pattern 1011 in a second direction (a horizontal direction within the paper surface in FIG. 4) intersecting (for example, perpendicular to) the first direction. For example, a layer of nitride with a thickness of about 10 nm-100 nm may be deposited in a substantially conformal manner, and then the deposited nitride layer may be anisotropically etched such as RIE in the vertical direction (which may be stopped at the etching stop layer 1009) to remove a transversal extension portion thereof and remain a vertical extension portion thereof, thereby obtaining the spacer 1017. The spacer 1017 may be served to define the position of the active area of the element subsequently.

The mandrel pattern and the spacer 1017 formed on the sidewalls thereof formed as described above extend in the first direction. A range of the mandrel pattern and the spacer 1017 in the first direction may be defined, and thus a range of the active area of the element in the first direction is defined.

Figure 5A:
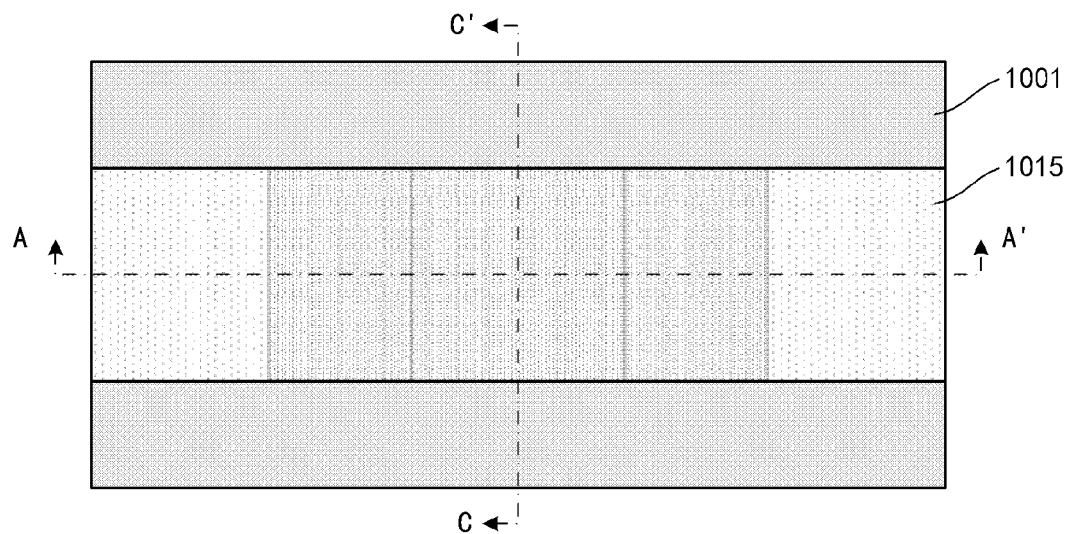
Figure 5B:
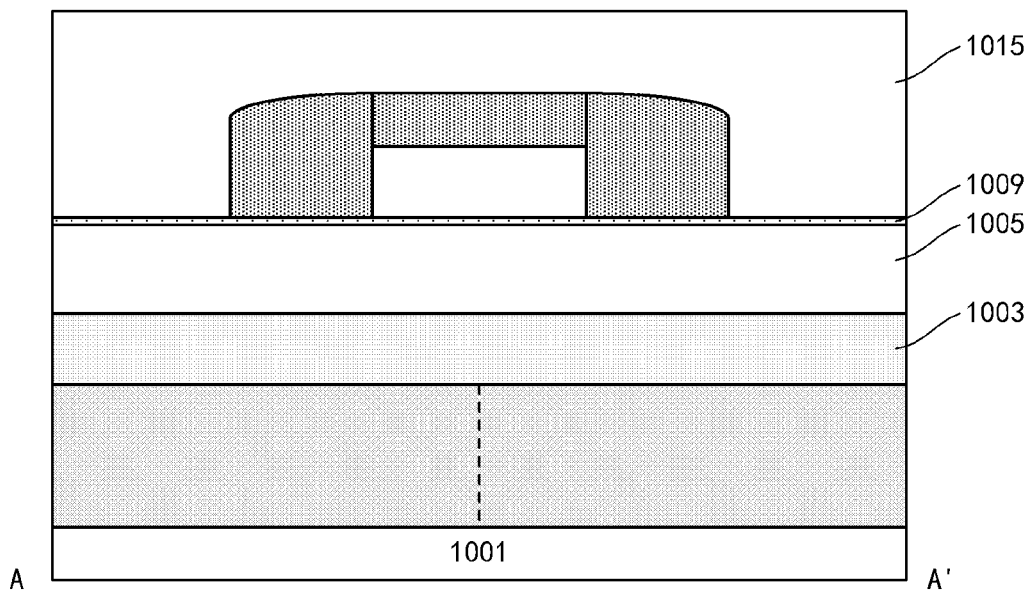
Figure 5C:
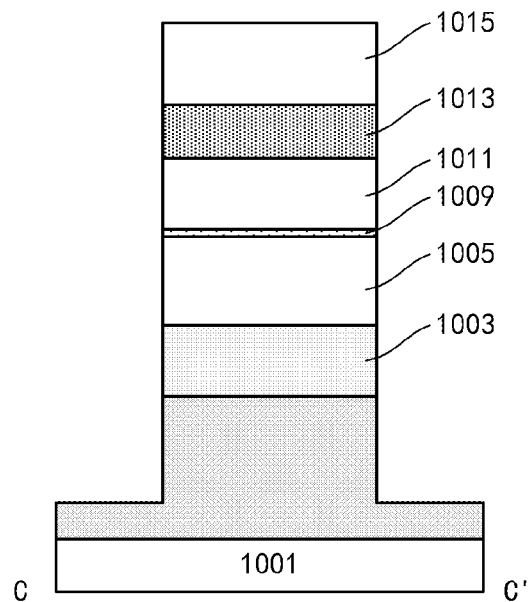
FIGS. 5(c), 6(d) are sectional views along CC' line.
Figure 6A:
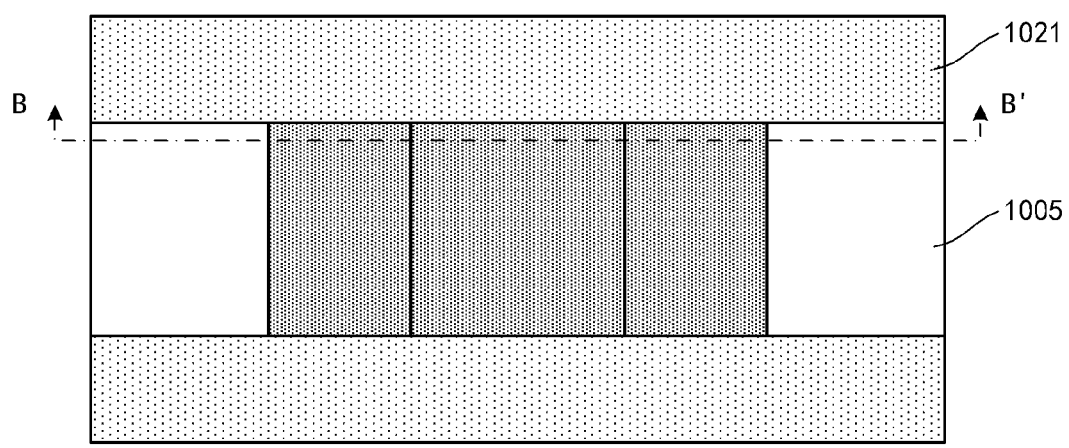
Figure 6B:
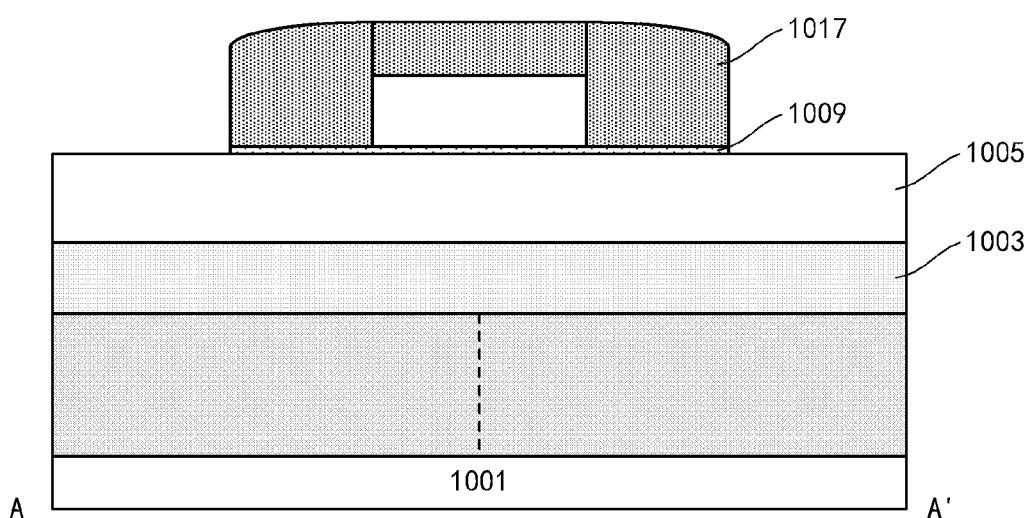
Figure 6C:
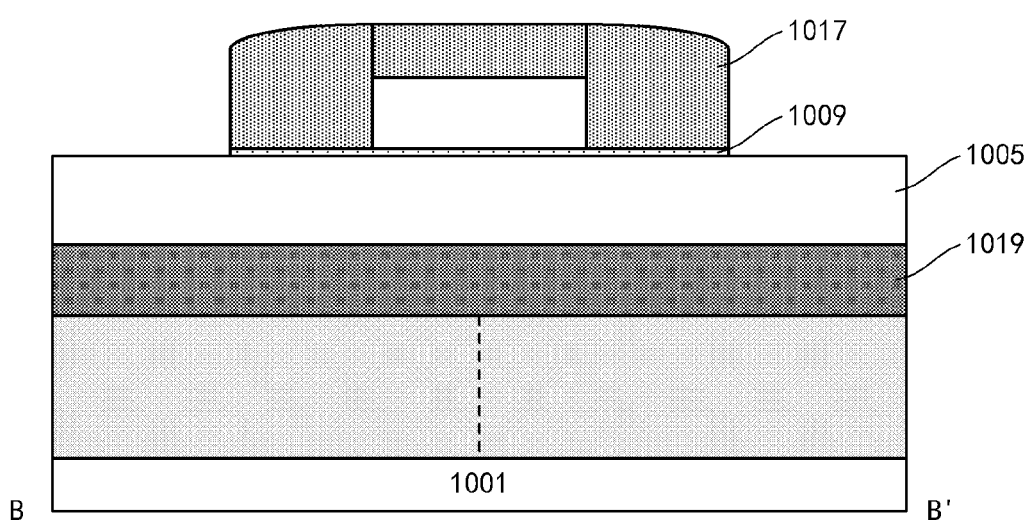
FIG. 6(c) is a sectional view along BB' line.
Figure 6D:
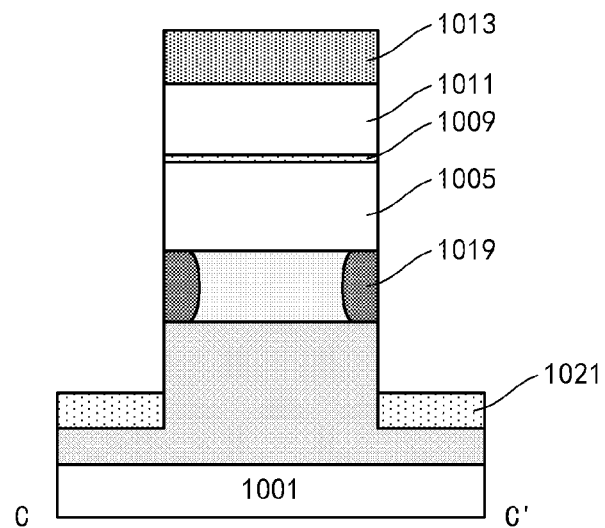

As shown in FIGS. 5(*a*)-5(*c*), a photoresist 1015 may be formed in the structure shown in FIG. 4, and it is patterned to occupy a certain range in the first direction through photolithography, for example, to form a stripe extending in a second direction perpendicular to the first direction. The photoresist 1015 may be configured as the etching mask, then the layers below it may be selectively etched in sequence through, for example, RIE. The etching may be performed into the substrate 1001, in particular the well region, to form grooves in the substrate 1001. The formed grooves may form isolations subsequently, for example, shallow trench isolations (STI). After that, the photoresist 1015 may be removed.

As shown in FIG. 5 (*c*), sidewalls of the second material layer 1003 in the first direction are exposed to the outside.

According to the embodiments of the present disclosure, in order to form the gate stack surrounding the channel portion, a space may be spared for the gate stack at two ends of the second material layer in the first direction.

For this, as shown in FIGS. 6(*a*)-6(*d*), the second material layer 1003 may be selectively etched, so that the sidewalls thereof are relatively concaved in the first direction. In order to better control an etched amount, atomic layer etching (ALE) may be adopted. For example, the etched amount may be about 5 nm-20 nm. Depending on characteristics of the etching, such as the etching selectivity of the second material layer 1003 relative to the substrate 1001 and the third material layer 1005, the sidewalls of the second material layer 1003 after etching may present different shapes. FIG. 6 (*d*) shows that the sidewalls of the second material layer 1003 after etching present C shapes concaved toward the inside. However, the present disclosure is not limited to this. For example, when etching selectivity is good, the sidewalls of the second material layer 1003 after etching may be close to vertical. Here, the etching may be isotropic, especially when a large etching amount is required. In the grooves formed as such, a dielectric material may be filled to define the space of the gate stack. The filling may be performed by deposition and then etching back. For example, a dielectric material, such as SiC, that is sufficient to fulfill the grooves, may be deposited on the substrate, and then the deposited dielectric material may be etched back through, such as RIE. In this way, the dielectric material outside the range defined by the hard mask layer 1013 and the spacer 1017 may be removed, and the dielectric material is left in the above-mentioned grooves to form a first placeholder layer 1019.

According to the embodiments of the present disclosure, a protection layer 1021 may also be formed on the substrate 1001. For example, an oxide layer may be formed on the substrate 1001 by deposition, and the deposited oxide layer may be planarized, for example, by chemical mechanical polishing (CMP) (CMP may be stopped at the hard mask layer 1013) and then further etched back to form the protection layer 1021. Here, the protection layer 1021 may be located in the grooves of the substrate 1001, and a top surface of which is lower than a top surface of the substrate 1001. In addition, in the process of etching back, a portion of the etching stop layer 1009 (which is also oxide in the example) exposed to the outside may also be etched. According to other embodiments, an operation of forming the protection layer 1021 may be performed before an operation of forming the first placeholder layer 1019 (including forming and filling the concave).

The protection layer 1021 may protect the surface of the substrate 1001. For example, in the example, a range of the active area in the first direction is defined firstly. Then, a range of the active area in the second direction is defined. The protection layer 1021 may avoid influencing the surfaces of the substrate in the grooves exposed to the outside currently (with reference to FIG. 5(*c*)) when defining the range in the second direction. In addition, in the case that different types of well regions are formed in the substrate 1001, the protection layer 1021 may protect the pn junction between different types of well regions from being damaged by etching (for example, the etch back when forming the first placeholder layer 1019).

Figure 7:
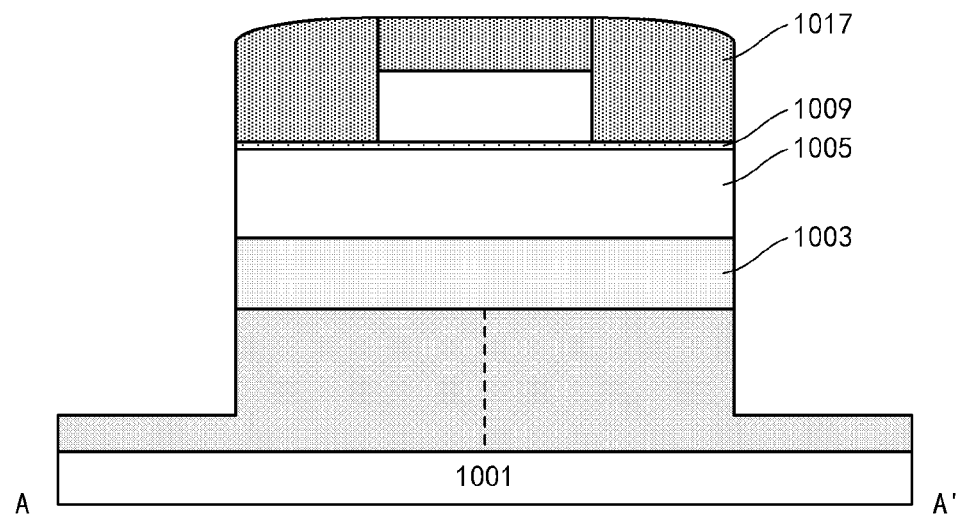

As shown in FIG. 7, the hard mask layer 1013 and the spacer 1017 may be used to pattern the third material layer 1005, the second material layer 1003 and the upper portion of the substrate 1001 (the first material layer) into a ridge-like structure (in fact, a range of the ridge-like structure in the first direction is defined by the above-mentioned process). For example, the hard mask layer 1013 and the spacer 1017 may be used as the etching mask. For example, the layers below the hard mask layer 1013 and the spacer 1017 may be selectively etched, for example, by RIE, to transfer the pattern of the hard mask layer 1013 and the spacer 1017 to the layers below them. Therefore, the upper portion of the substrate 1001, the second material layer 1003 and the third material layer 1005 may form a ridge-like structure. As described above, due to the presence of the protection layer 1021, the etching may not affect portions of the substrate 1001 on two sides of the ridge-like structure in the first direction.

Here, the etching may be performed into the well region of the substrate 1001. An extent of the etching into the substrate 1001 may be substantially the same or similar to the extent of the etching into the substrate 1001 described above with reference to FIGS. 5(*a*)-5(*c*). Similarly, the grooves are formed in the substrate 1001. And the protection layer may also be formed in these grooves (with reference to 1023 in FIG. 8). The protection layer 1023 and the previous protection layer 1021 surround a periphery of the ridge-like structure together. In this way, a similar processing condition may be formed at a surrounding of the ridge-like structure, that is, the grooves are formed in the substrate 1001, and the protection layers 1021, 1023 are formed in the grooves.

Figure 8:
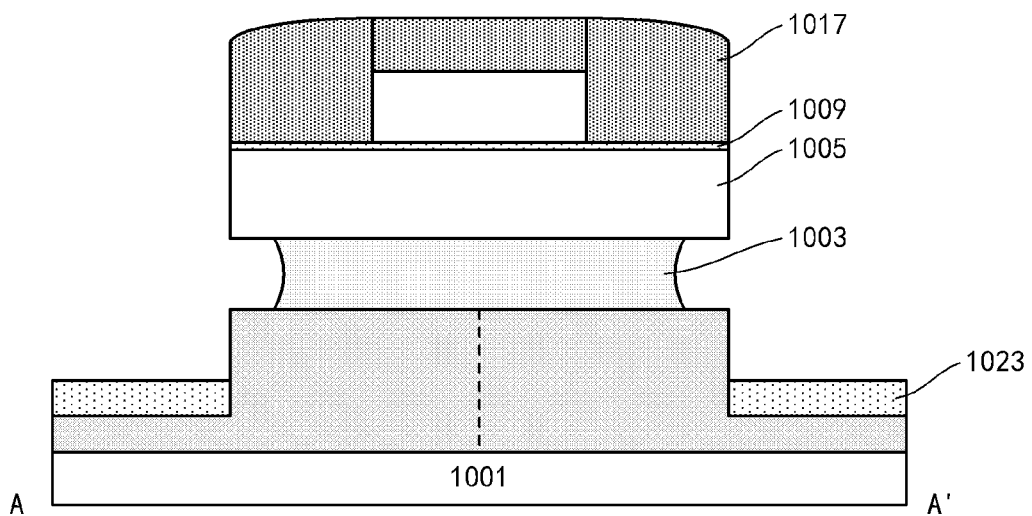

Similarly, in order to form the gate stack surrounding the channel portion, a space for the gate stack may be spared at both ends of the second material layer in the second direction. For example, as shown in FIG. 8, the second material layer 1003 may be selectively etched so that the sidewalls thereof in the second direction are relatively concaved (so that the space for the gate stack may be defined). To better control the etched amount, ALE may be adopted. For example, the etched amount may be about 10 nm-40 nm. As described above, the sidewalls of the second material layer after the etching may present C shapes concaved toward the inside. Here, the etching may be isotropic, especially when a large etching amount is required. The C shapes formed on both sides may be symmetrical with respect to each other. In general, curvatures of the C-shaped sidewalls of the second material layer 1003 at the upper end and the lower end are relatively large, and curvatures at the waist or the middle portion are relatively small.

Figure 9:
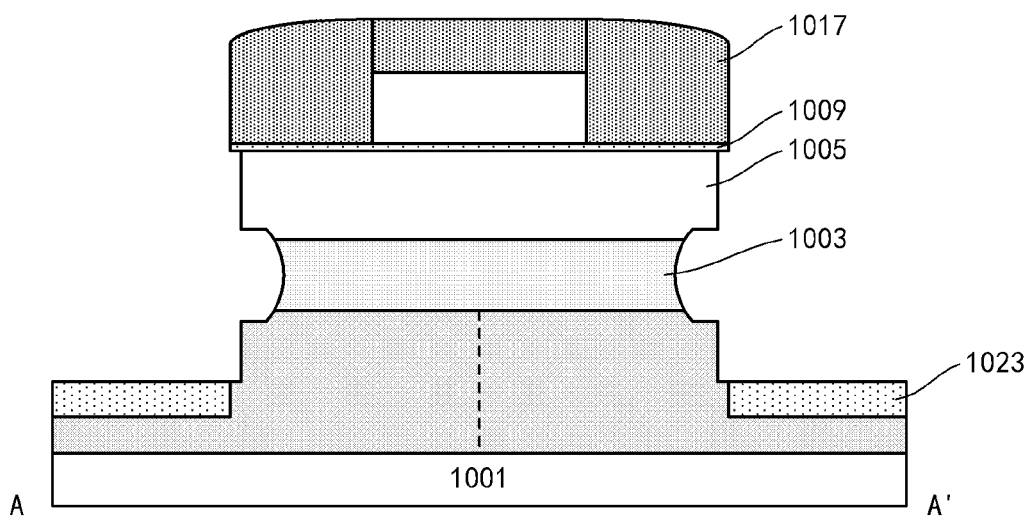

The first active layer may be formed on the sidewalls of the ridge-like structure so as to define the channel portion subsequently. In order to keep gate lengths of the gate stacks (for example, in a direction perpendicular to the surface of the substrate) substantially equal to each other when forming the gate stacks on the left side and the right side of the C-shaped channel portion subsequently, as shown in FIG. 9, the ridge-like structure (specifically, the exposed surfaces of the first material layer, the second material layer and the third material layer) may be etched back, so that the peripheral sidewalls thereof are concaved transversely relative to the peripheral sidewalls of the spacer 1017. To better control the etched amount, ALE may be adopted. The etched amount may be substantially equal to the thickness of the first active layer to be formed subsequently, for example, about 5 nm-15 nm.

Figure 10:
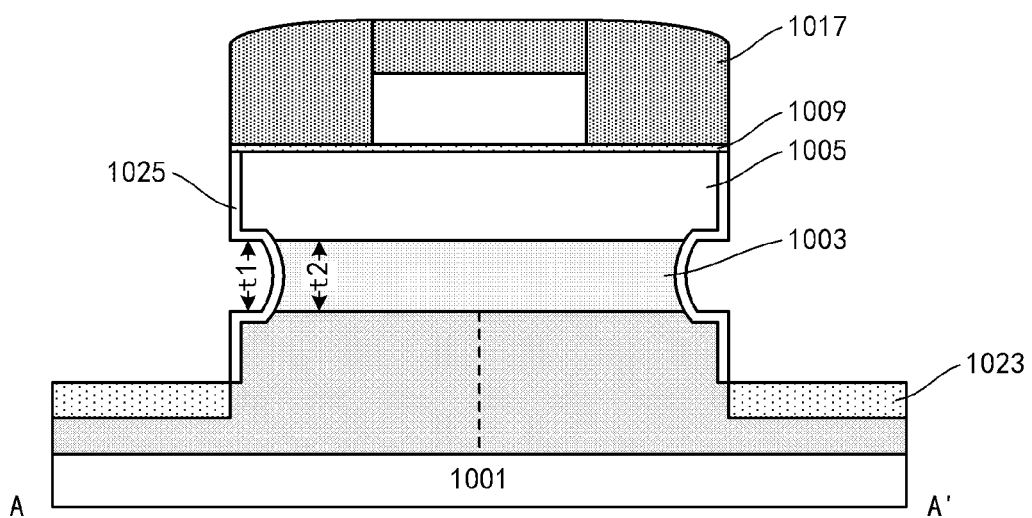

Then, as shown in FIG. 10, the first active layer 1025 may be formed on the sidewall of the ridge-like structure by, for example, selective epitaxial growth. Due to the selective epitaxial growth, the first active layer 1025 may not be formed on the surface of the first placeholder layer 1019. The first active layer 1025 may then define the channel portion, and the thickness of which is for example, about 3 nm-15 nm. According to the embodiments of the present disclosure, the thickness of the first active layer 1025 (which is to be served as the channel portion) may be determined by an epitaxial growth process, and thus the thickness of the channel portion may be better controlled. The first active layer 1025 may be doped in situ during epitaxial growth to adjust a threshold voltage of the element.

In FIG. 10, a sidewall of the portion of the first active layer 1025 on the sidewalls of the first material layer and the third material layer is shown to be substantially flush with the sidewall of the spacer 1017. This may be realized by controlling the amount of the etch back and the thickness of epitaxial growth to be substantially the same. However, the present disclosure is not limited to this. For example, the sidewall of the portion of the first active layer 1025 on the sidewalls of the first material layer and the third material layer may be concaved with respect to the sidewall of the spacer 1017, or may even be protruded with respect to the sidewall of the spacer 1017.

Here, by performing the above-mentioned etch back, the upper end and the lower end of the concave portion may be respectively etched upwardly and downwardly, so that after the first active layer 1025 is formed, a height t1 of the concave portion and the thickness t2 of the second material layer 1003 may be substantially the same. In this way, the gate stacks formed subsequently on the left side and the right side of the active layer 1025 may have gate lengths that are substantially equal to each other. However, the present disclosure is not limited to this. According to the embodiments of the present disclosure, the gate lengths outside the first active layer 1025 may be altered by adjusting the amount of the etch back, to change a ratio of the gate lengths on both sides to optimize an influence on element performance due to a difference in morphology on the left side and the right side of the C-shaped channel portion.

The material of the first active layer 1025 may be appropriately selected according to performance requirements of the element design. For example, the first active layer 1025 may include various semiconductor materials, such as Si, Ge, SiGe, InP, GaAs, InGaAa, etc. In the example, the first active layer 1025 may include the same material as that of the first material layer and the third material layer, such as Si.

In the example of FIG. 10, the first active layers 1025 of the ridge-like structure on two opposite sides in the second direction may have substantially same features (for example, materials, sizes, doping characteristics, etc.), and may be arranged symmetrically to each other on two opposite sides of the second material layer. However, the present disclosure is not limited to this. As described below, through a single ridge-like structure, two elements opposite to each other may be formed. According to the performance requirements of the design of the two elements, the first active layers 1025 on two opposite sides of the ridge-like structure may have different characteristics, for example, in at least one aspect of thicknesses, materials, and doping characteristics. For example, for a p-type element, the first active layer 1025 may include SiGe, Ge, etc.; for an n-type element, the first active layer 1025 may include InGaAs, InP, or other III-V compound semiconductors, etc. This may be realized by shielding another element area when the first active layer is grown in one element area. Since the first active layer 1025 is relatively thin, and stress may be released in the up and down direction, a quality of a film is relatively less affected by lattice constant mismatch, and the thin film quality is better.

Figure 11:
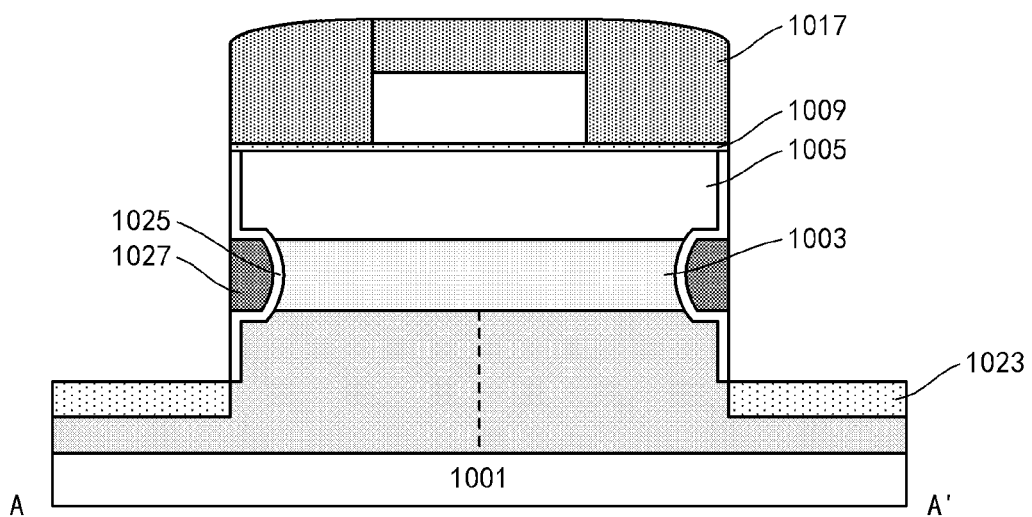

Since the second material layer 1003 is concaved, a recess is formed outside the portion of the first active layer 1025 corresponding to the second material layer 1003. In the recess, a gate stack may be formed subsequently. In order to prevent subsequent processing from leaving unnecessary materials in the recess or affecting the first active layer 1025, as shown in FIG. 11, a second placeholder layer 1027 may be formed in the recess. Similarly, the second placeholder layer 1027 may be formed by deposition and then etching back, and may include a dielectric material such as SiC. In this example, the first placeholder layer 1019 and the second placeholder layer 1027 include the same material, so that they may be removed together with the same etching recipe subsequently. However, the present disclosure is not limited to this, for example, they may include different materials.

After that, a source/drain doping may be performed.

Figure 12:
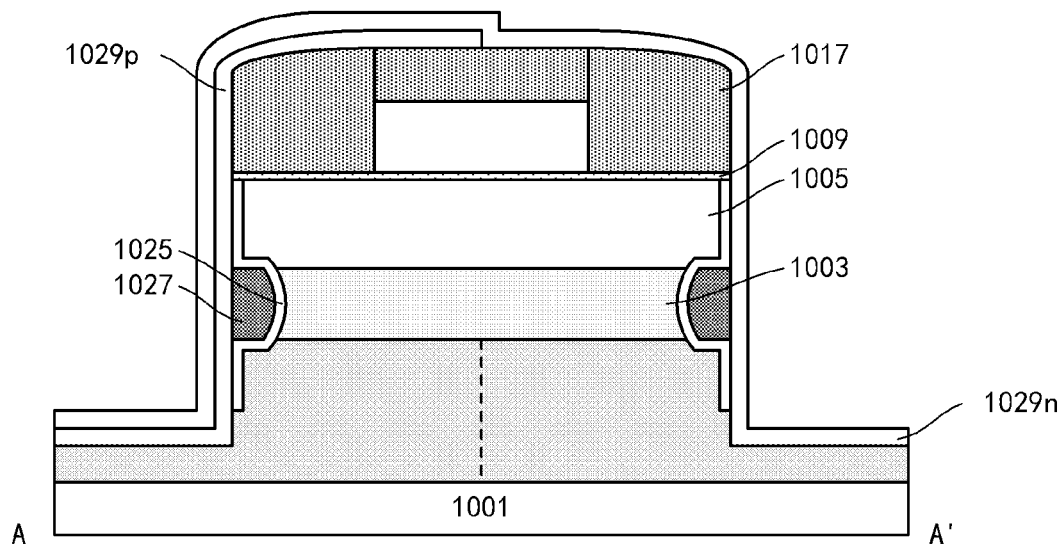

As shown in FIG. 12, a solid phase dopant source layer may be formed on the structure shown in FIG. 11 by, for example, deposition. Here, solid phase dopant source layers for a p-type element and an n-type element may be formed, respectively. For example, a solid phase dopant source layer 1029$p$ for a p-type element may be formed. The solid phase dopant source layer 1029$p$ may extend in a p-type element area (an area above the n-type well region) and an n-type element area (an area above the p-type well region). A photoresist (not shown) may be used to shield the p-type element area to expose the n-type element area, and etch the solid phase dopant source layer 1029$p$ on the n-type element area, so that the solid phase dopant source layer 1029$p$ is remained in the p-type element area. After that, a solid phase dopant source layer 1029$n$ for an n-type element may be formed. In order to avoid interdiffusion between the solid phase dopant source layer 1029$p$ and the solid phase dopant source layer 1029$n$, a diffusion barrier layer (for example, a nitride with a thickness of about 1 nm-5 nm, not shown) may be formed between them.

The solid phase dopant source layers 1029$p$ and 1029$n$ may be formed in a substantially conformal manner. For example, the solid phase dopant source layers 1029$p$ and 1029$n$ may be oxides containing dopants and have a thicknesses of about 1 nm-5 nm. The dopants contained in the solid phase dopant source layers 1029p and 1029n may be used to dope the source/drain portions (and optionally, the exposed surfaces of the substrate 1001), and therefore may have the same conductivity type as the source/drain portions to be formed as required. For example, for a p-type element, the solid phase dopant source layer 1029p may contain a p-type dopant such as B or In; for an n-type element, the solid phase dopant source layer 1029n may contain an n-type dopant such as P or As. A concentration of the dopant of the solid phase dopant source layer 1029 may be about 0.1%-5%.

In the example, before the solid phase dopant source layer 1029 is formed, the protection layer 1021, 1023 may be selectively etched by for example, RIE, to expose the surfaces of the substrate 1001. In this way, the exposed surfaces of the substrate 1001 may also be doped to form respective contact areas of lower source/drain portions of two elements.

Figure 13:
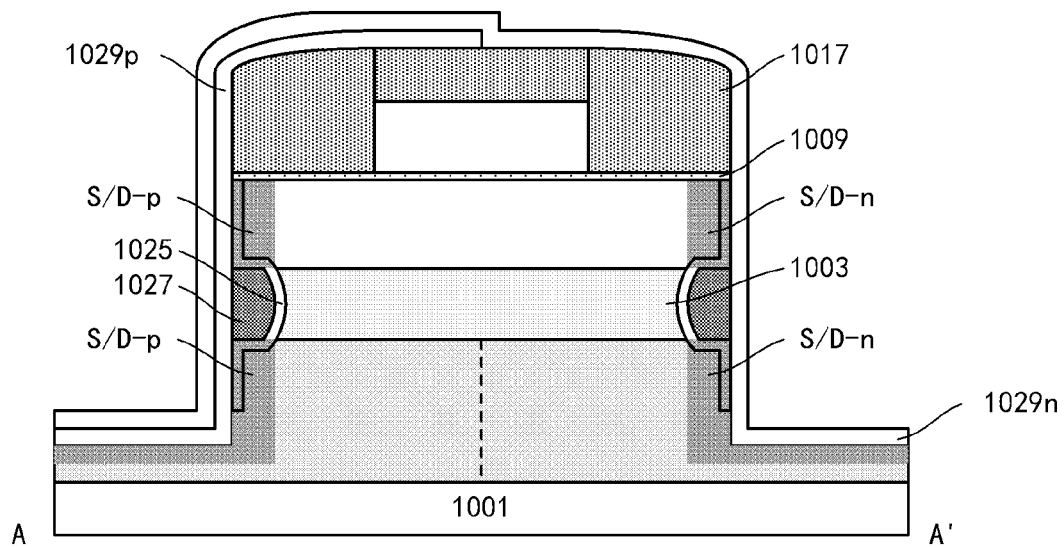

Annealing may be performed to drive the dopants in the solid phase dopant source layers 1029p, 1029n into the first material layer and the third material layer to form a source/drain portion S/D-p for the p-type element and a source/drain portion S/D-n for the n-type element (and optionally, the dopants may be driven into the exposed surfaces of the substrate 1001 to form respective contact areas of lower source/drain portions of the two elements), as shown in FIG. 13. After that, the solid phase dopant source layers 1029p, 1029n may be removed.

As the first material layer and the third material layer may have the same material and the solid phase dopant source layers 1029 may be formed on the surfaces thereof in a substantially conformal manner, an extent of the dopant driven from the solid phase dopant source layers 1029 into the first material layer may be substantially equal to an extent of the dopant driven from the solid phase dopant source layers 1029 into the third material layer. Thus, an (doping concentration) interface of the source/drain portion (between inner portions of the first material layer, the third material layer) may be substantially parallel to surfaces of the first material layer and the third material layer, that is, they may extend in the vertical direction, and they may be aligned with each other.

In the example, the first material layer is provided by the upper portion of the substrate 1001. However, the present disclosure is not limited to this. For example, the first material layer may also be an epitaxial layer on the substrate. In this case, the first material layer and the third material layer may be doped in situ during epitaxial growth, rather than doped by the solid phase dopant source layer.

Figure 14A:
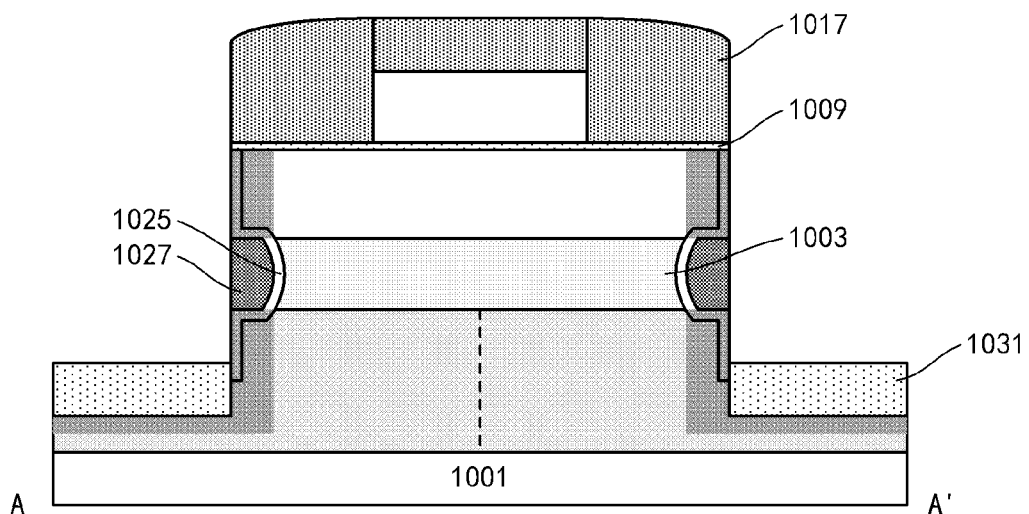

In the groove surrounding the ridge-like structure, an isolation layer 1031 may be formed, as shown in FIG. 14(a). The isolation layer is formed in a way similar to that of forming the protection layer 1021, 1023, which will not be repeated here.

Figure 14B:
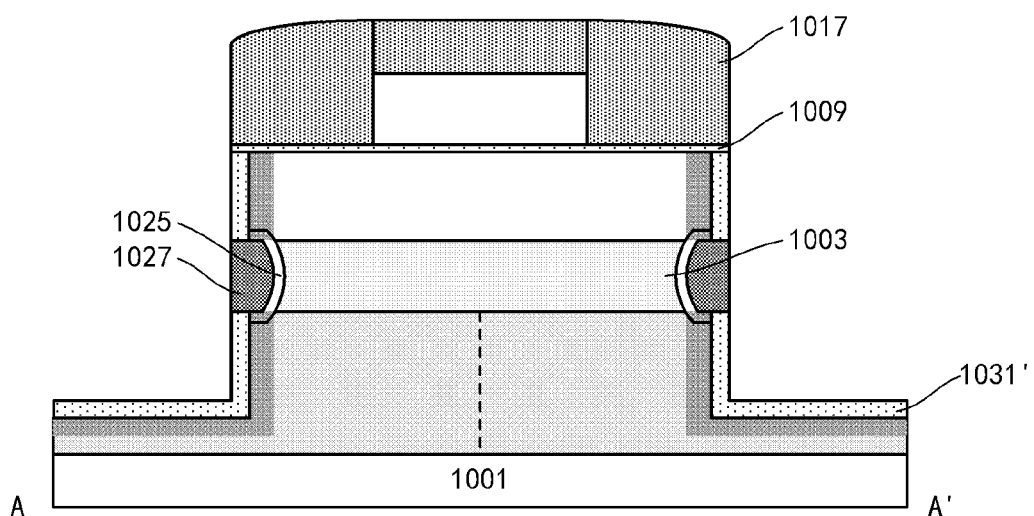

To reduce a capacitance between the gate and the source/drain, an overlap between the gate and the source/drain may be further reduced. For example, as shown in FIG. 14(b), after the solid phase dopant source layers 1029 are removed, the exposed surfaces of the first material layer and the third material layer may be further concaved through selective etching, thereby an overlap between the source/drain formed in the first material layer and the third material layer and the first placeholder layer 1019, the second placeholder layer 1027 (which define the position of the gate stack subsequently formed) is reduced. The surfaces of the first material layer and the third material layer are concaved to form a recess below the hard mask layer 1013 and the spacer 1017, and a dielectric 1031' such as nitride or oxide may be filled in the recess. The filling may be realized by deposition (and planarization) and then etching back. During the etching back, a certain thickness of the dielectric 1031' is remained on the surfaces of the substrate 1001 to form the isolation portion.

In the following, for convenience, the case shown in FIG. 14(a) is still taken as an example for description.

Next, the spacer 1017 may be used to accomplish defining the active area.

Figure 15:
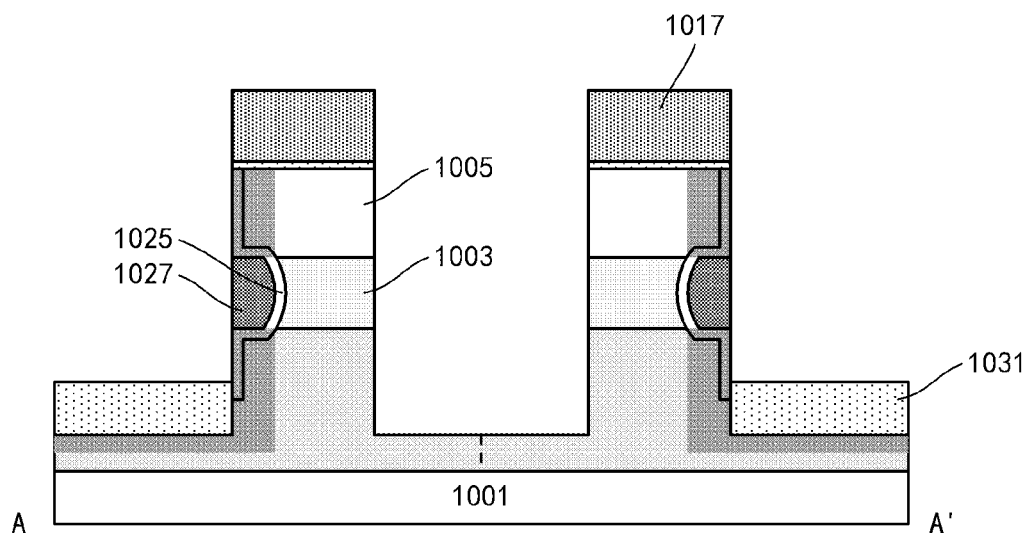

As shown in FIG. 15, the hard mask layer 1013 may be removed to expose the mandrel pattern 1011 through selective etching such as RIE, or planarization such as CMP. In the process of removing the hard mask layer 1013, a height of the spacer 1017, which is nitride as well in the example, may be reduced. Then, the mandrel pattern 1011 may be removed by selective etching, such as wet etching using TMAH solution or dry etching such as RIE. In this way, a pair of spacers 1017 extending opposite to each other may be left in the ridge-like structure (an upper end morphology may also be changed due to the height reduction).

The spacer 1017 may be used as the etching mask, and the etching stop layer 1009, the third material layer 1005, the second material layer 1003, and the upper portion of the substrate 1001 may be selectively etched in sequence by, for example, RIE. The etching may be performed into the well region of the substrate 1001. In this way, in the space surrounded by the isolation layer 1031, the third material layer 1005, the second material layer 1003 and the upper portion of the substrate 1001 form a pair of stacks corresponding to the spacer 1017 to define the active area.

Of course, the formation of the stack for defining the active area is not limited to spacer pattern transfer technology, and the stack for defining the active area may also be formed through photolithography by using a photoresist.

Here, for the purpose of epitaxial growth, the second material layer 1003 for defining the position of the gate stack includes a semiconductor material. For ease of subsequent replacement gate process, the second material layer 1003 may be replaced with a dielectric material to form the third placeholder layer.

Figure 16A:
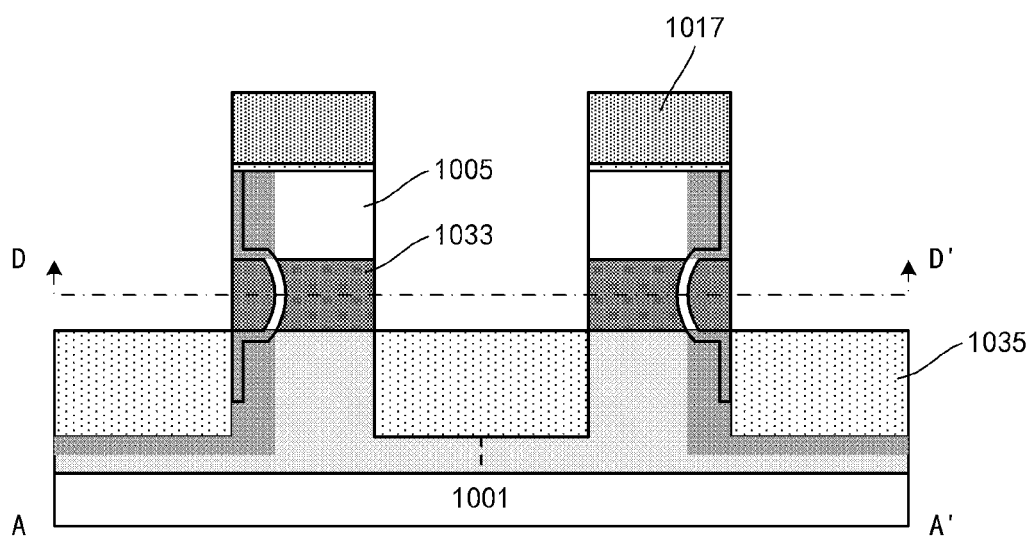
Figure 16B:
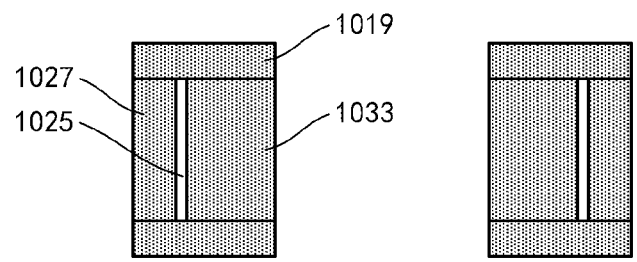
FIGS. 16(b), 18(c), 20(c) are sectional views taken along DD' line in FIG. 16(a).

For example, As shown in FIGS. 16(a) and 16(b), the second material layer 1003 (SiGe in the example) may be removed by selective etching with respect to the first active layer 1025, the substrate 1001, and the third material layer 1005 (all Si in this example), Then, the third placeholder layer 1033 may be formed in a recess that is left below the spacer 1017 due to the removal of the second material layer 1003. Similarly, the third placeholder layer 1033 may be formed by deposition and then etching back. In this example, the third placeholder layer 1033 may include the same material as the first placeholder layer 1019 and the second placeholder layer 1027 so as to be subsequently removed by the same etching recipe in the replacement gate process.

As shown in FIG. 16(b), the first placeholder layer 1019, the second placeholder layer 1027, and the third placeholder layer 1033 (which together define the position of the gate stack) surround a portion of the first active layer 1025. This portion of the first active layer 1025 may serve as the channel portion. It may be seen that the channel portion is a C-shaped curved nano-sheet (when the nano-sheet is narrow, for example, when a vertical dimension in the paper surface in FIG. 16(b) is small, it may become a nano-wire). Due to a high etching selectivity relative to the first active layer 1025 (Si) when etching the second material layer 1003 (SiGe), the thickness of the channel portion (in the case of nano-wire, it is the thickness or the diameter) is substantially determined by the selective growth process of the first active layer 1025. As the epitaxial growth process has much better process control than etching or photolithography, it has a huge advantage over the technology that only uses an etching method or a photolithography method to determine the thickness.

In order to reduce the overlap between the gate stack and the source/drain portions, especially the lower source/drain portion, a height of the isolation layer 1031 may be increased. For example, an isolation layer 1035 may be formed by deposition (and planarization) and then etching back. For example, the isolation layer 1035 may include oxide, and thus is shown as an integrity with the previous isolation layer 1031. A top surface of the isolation layer 1035 may be close to, for example, not lower than (preferably, slightly higher than) a top surface of the first material layer (i.e., the top surface of the substrate 1001) or a bottom surface of the second material layer (i.e., the bottom surfaces of the first placeholder layer 1019, the second placeholder layer 1027, and the third placeholder layer 1033), and not higher than the top surface of the second material layer (i.e., the top surfaces of the first placeholder layer 1019, the second placeholder layer 1027, and the third placeholder layer 1033) or the bottom surface of the third material layer.

Figure 17:
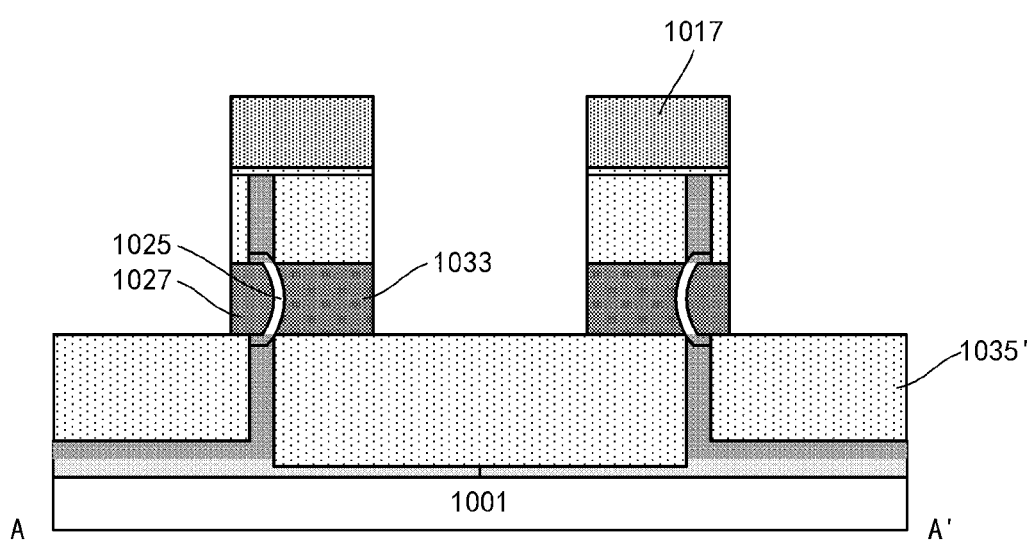

According to another embodiment of the present disclosure, to reduce the capacitance, the overlap between the gate and the first/third material layer (with the source/drain portion formed therein) may be further reduced. For example, as shown in FIG. 17, after the third placeholder layer 1033 is formed as described above, the exposed surfaces of the first material layer and the third material layer may be further concaved through selective etching. Thereby, the overlap between the first/third material layer and the third placeholder layer 1033 (which defines the position of the gate stack subsequently) is reduced. After that, the isolation layer 1035' may be formed similarly. In the process of forming the isolation layer 1035', the dielectric material of the isolation layer 1035' may also fills the recess below the spacer 1017 due to the concave of the third material layer.

In the example shown in FIG. 17, a structure that is obtained by performing the process of reducing the overlap with reference to the description of FIG. 17 in addition to the process of reducing the overlap with reference to the description of FIG. 14(*b*) is shown. Thus, the periphery of the source/drain portion is surrounded by the dielectric material. However, the present disclosure is not limited to this. For example, the processing process for reducing the overlap with reference to the description of FIG. 14(*b*) and the processing process for reducing the overlap with reference to the description of FIG. 17 may be performed alternatively, or both.

In the following description, the case shown in FIGS. 16(*a*) and 16(*b*) is still taken as the example for description.

Next, the replacement gate process may be performed to form the gate stack.

Figure 18A:
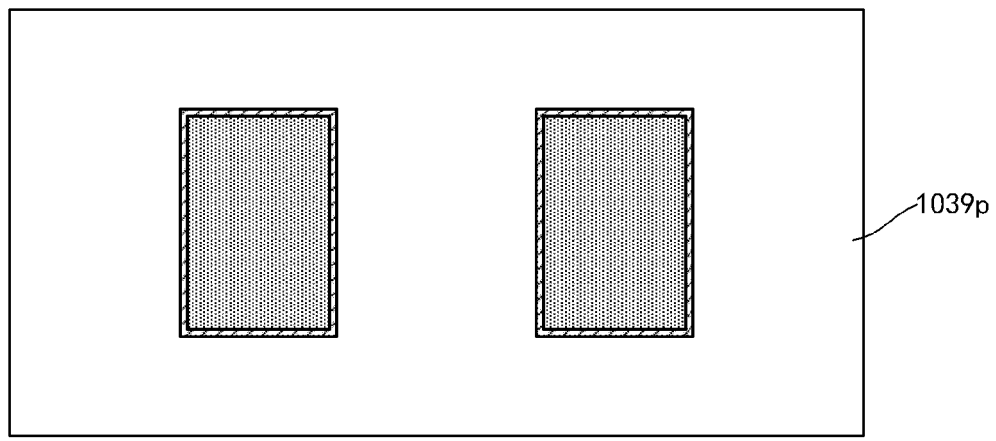
Figure 18B:
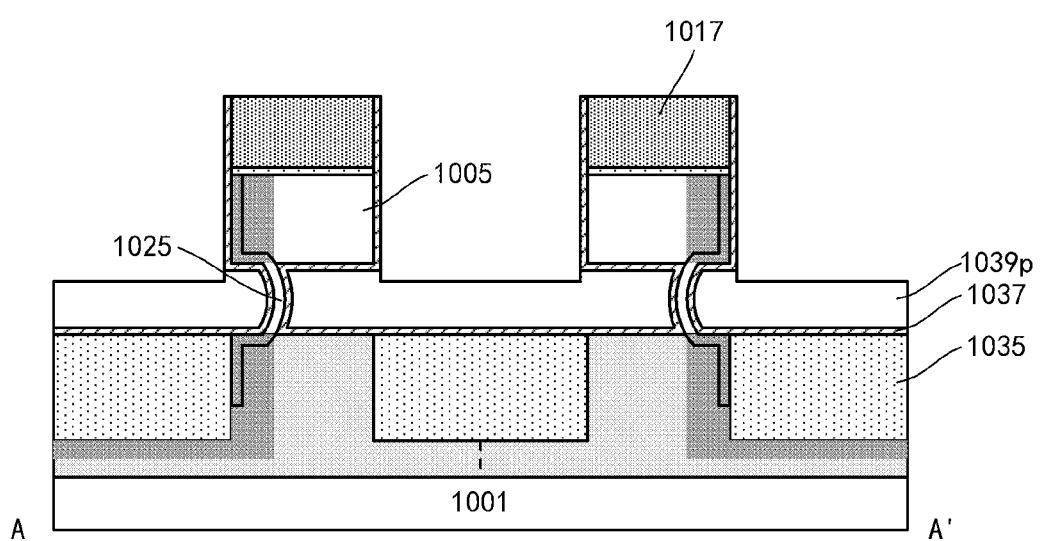
Figure 18C:
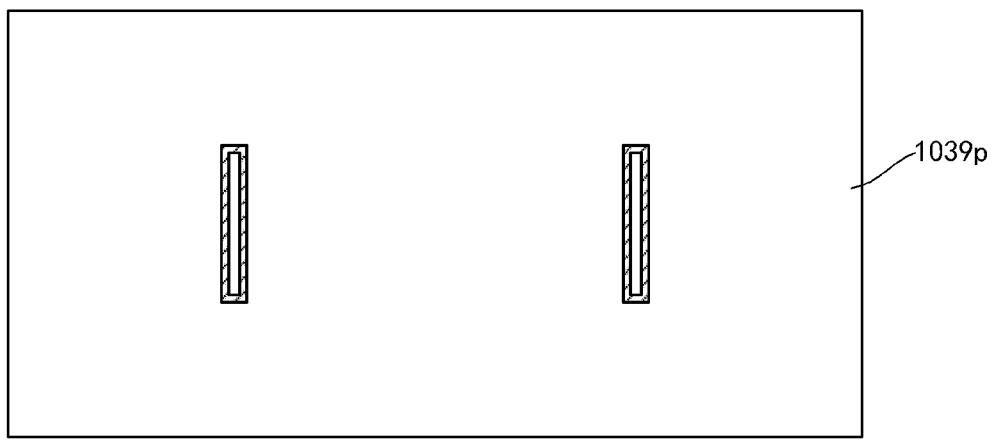

As shown in FIGS. 18(*a*) to 18(*c*), the first placeholder layer 1019, the second placeholder layer 1027, and the third placeholder layer 1033 may be removed by selective etching, and the gate stack is formed on the isolation layer 1035. For example, a gate dielectric layer 1037 may be formed in a substantially conformal manner by deposition, and a gate conductor layer 1039*p* is formed on the gate dielectric layer 1037. The gate conductor layer 1039*p* may fill the space between the active areas. The gate conductor layer 1039*p* may be planarized, such as CMP, and CMP may be stopped at the spacer 1017. Then, the gate conductor layer 1039*p* may be etched back so that the top surface thereof is lower than the previous top surface of the first placeholder layer 1019, the second placeholder layer 1027, and the third placeholder layer 1033 (or the top surface of the second material layer and the bottom surface of the third material layer), to reduce the capacitance between the source/drain portion and the gate stack. In this way, an end portion of the formed gate stack is embedded in the space where the first placeholder layer 1019, the second placeholder layer 1027, and the third placeholder layer 1033 are located previously, and surrounds the channel portion.

For example, the gate dielectric layer 1037 may include a high-k gate dielectric such as $HfO_2$, and a thickness thereof is, for example, about 1 nm-5 nm. Before forming the high-k gate dielectric, an interface layer may also be formed, for example, an oxide formed by an oxidation process or deposition such as atomic layer deposition (ALD), with a thickness of about 0.3 nm-1.5 nm. Here, the gate conductor layer 1039*p* may be used for a p-type element, and thus may include a work function adjusting metal such as TiN, TaN, etc., and a gate conductive metal such as W, etc. for the p-type element.

The gate conductor layer 1039*p* for the p-type element is also formed in the n-type element area currently. The gate conductor layer 1039*p* in the n-type element area may be removed, and may also be patterned to form a landing pad of a gate contact portion.

Figure 19:
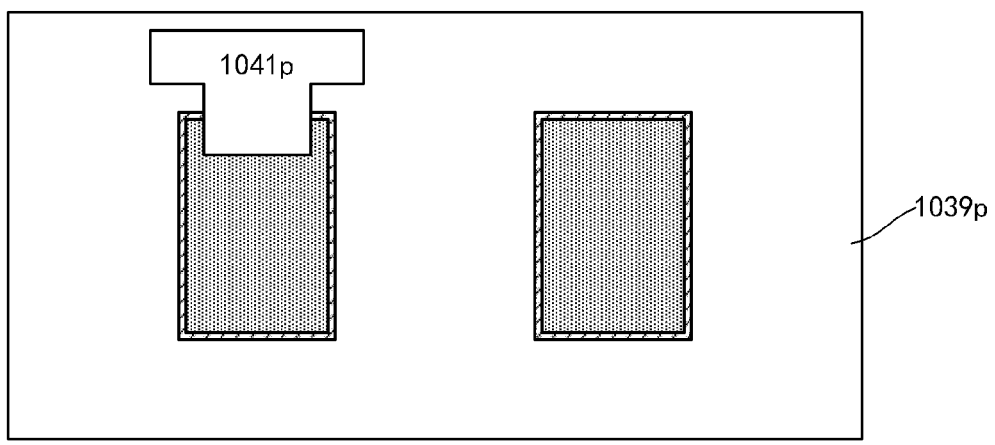

As shown in FIG. 19, a photoresist 1041*p* may be formed and patterned to shield an area where the landing pad of the gate contact portion is to be formed in the p-type element area, while exposing other areas (including the n-type element area). Then, as shown in FIGS. 20(*a*) to 20(*c*), the photoresist 1041*p* (and the spacer 1017) may be used as the mask to selectively etch the gate conductor layer 1039*p*, for example, by RIE. The RIE may stop at the gate dielectric layer 1037. After that, the photoresist 1041*p* may be removed.

Therefore, in the p-type element area, the gate conductor layer 1039*p* is substantially left below and self-aligned with the spacer 1017, except for a portion protruding on one side of the spacer 1017 (the upper side in FIG. 20(*a*)) to serve as the landing pad. The gate conductor layer 1039*p* and the gate dielectric layer 1037 combine to define the gate stack for the p-type element.

Figure 21:
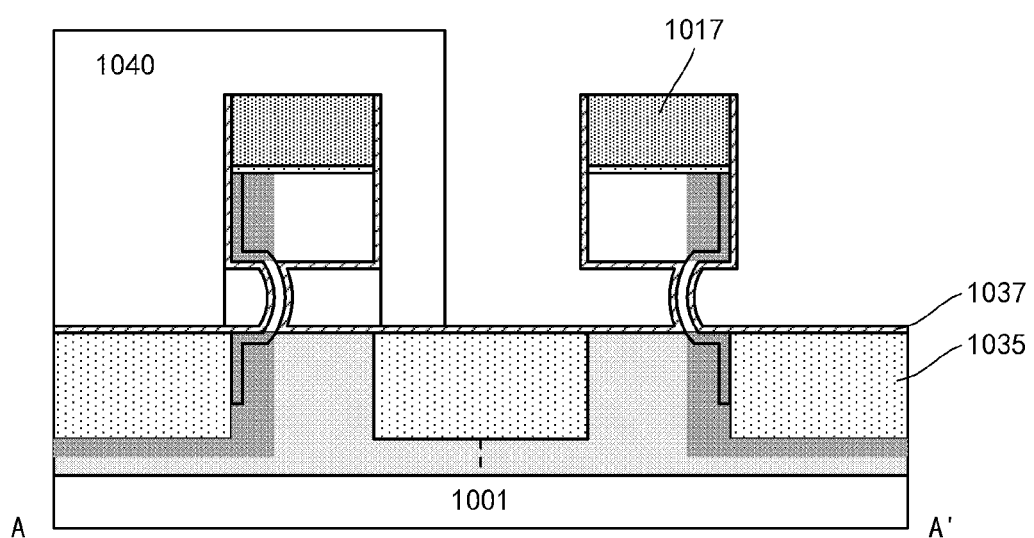
Figure 22A:
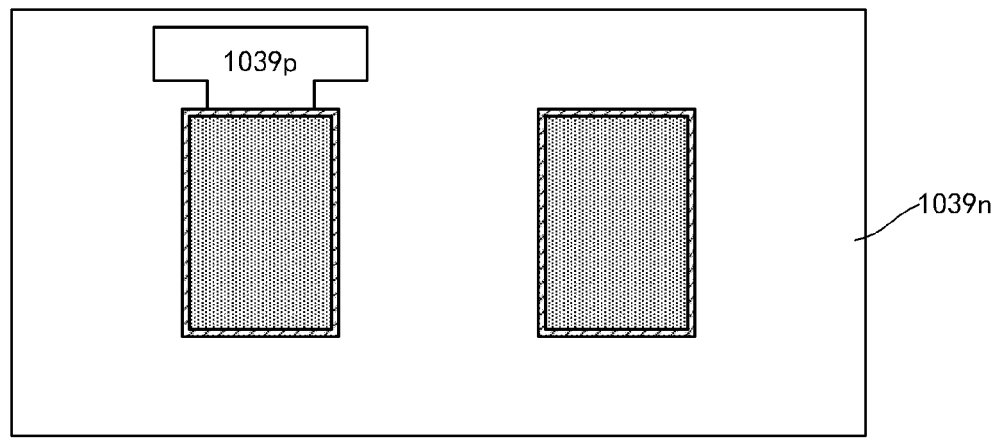
Figure 22B:
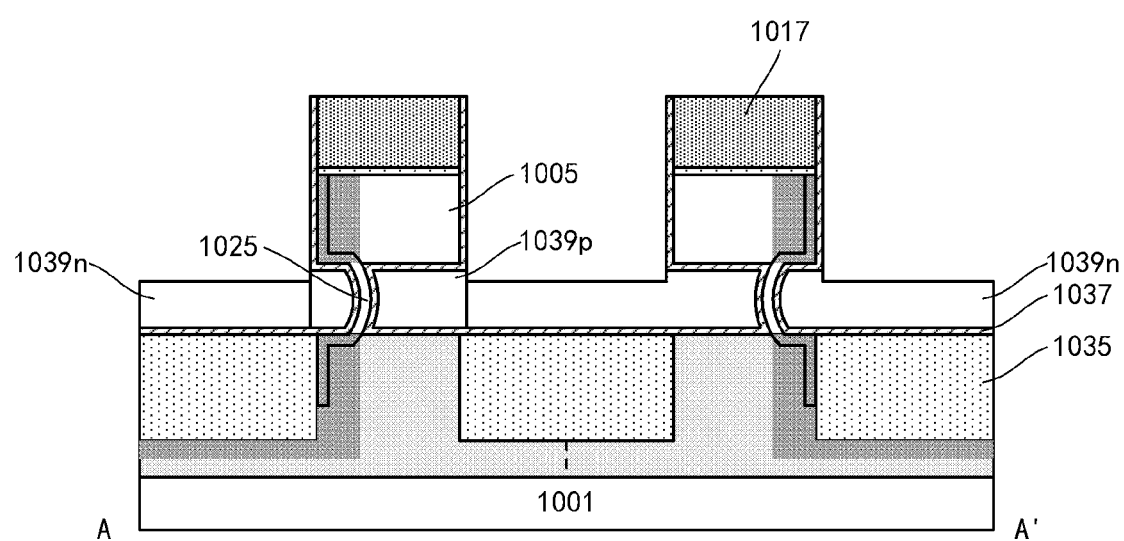

Currently, the gate conductor layer 1039*p* for the p-type element is still remained below the spacer 1017 in the n-type element area, and is needed to be removed. As shown in FIG. 21, a photoresist 1040 may be formed and patterned to shield the p-type element area and expose the n-type element area. Then, the gate conductor layer 1039*p* in the n-type element area may be removed by selective etching. After that, the photoresist 1040 may be removed.

As shown in FIGS. 22(*a*) and 22(*b*), a gate conductor layer 1039*n* for the n-type element is formed in a manner similar to that of forming the gate conductor layer 1039. The gate conductor layer 1039*n* may include a work function adjusting metal such as TiN, TaN, TiAlC, etc., and a gate conductive metal such as W, etc. for the n-type element.

Currently, the respective gate stacks of the two elements are connected to each other as an integrity. According to the element design, the gate conductor layer 1039*n* may be disconnected between the two elements through for example, photolithography, while the landing pad of the gate contact portion may also be patterned.

Figure 23:
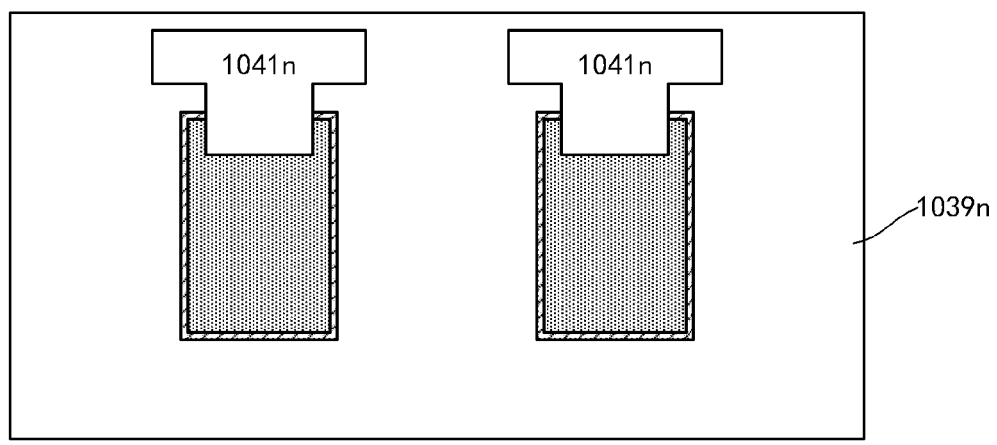
Figure 24:
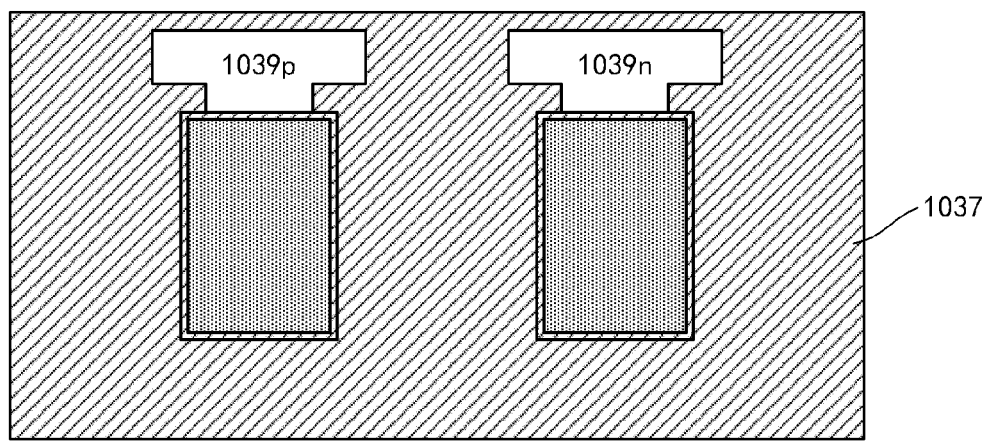

As shown in FIG. 23, the photoresist 1041*n* may be formed and patterned to shield areas of the landing pad formed in the p-type element area and the landing pad in n-type element area to form the gate contact portion, and expose other areas. Then, as shown in FIG. 24, the photoresist 1041n (and the spacer 1017) may be used as the mask to selectively etch the gate conductor layer 1039n, for example by ME, and the ME may stop at the gate dielectric layer 1037. After that, the photoresist 1041n may be removed.

Therefore, in the n-type element area, the gate conductor layer 1039n is substantially left below and self-aligned with the spacer 1017, except for a portion protruding on one side of the spacer 1017 (the upper side in FIG. 24) to serve as the landing pad. The gate conductor layer 1039n and the gate dielectric layer 1037 combine to define the gate stack for the n-type element.

In this example, the p-type element and the n-type element have the same gate dielectric layer 1039. However, the present disclosure is not limited to this. For example, the p-type element and the n-type element may have different gate dielectric layers. When using different materials for different types of elements, they may be processed separately. As described above, when processing one type of element, a shielding layer may be used to shield an area where another type of element is located, and the processing order of which may be exchanged.

In the example, the respective landing pads of the two elements are located on the same side of the spacer 1017. However, the present disclosure is not limited to this. For example, the respective landing pads of the two elements may be located on different sides of the spacer 1017.

So far, the manufacturing of a basic structure of the element is completed. Then, various contact portions, interconnect structures, etc. may be prepared.

Figure 25A:
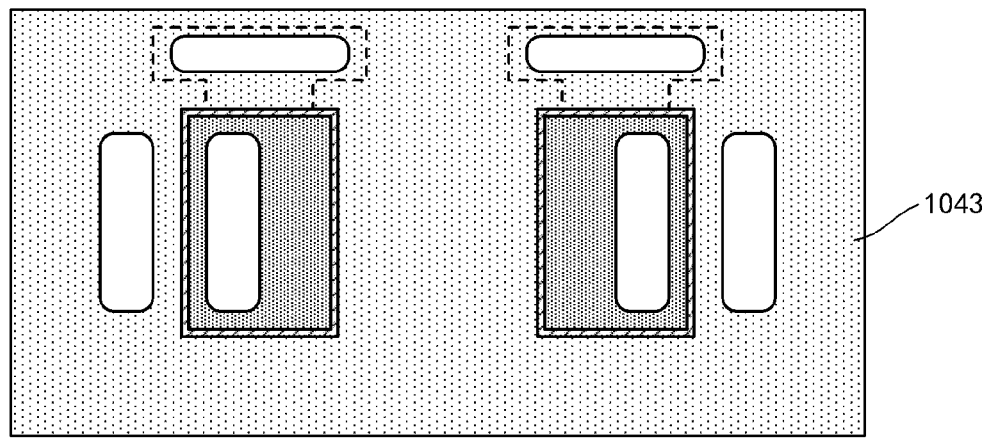
Figure 25B:
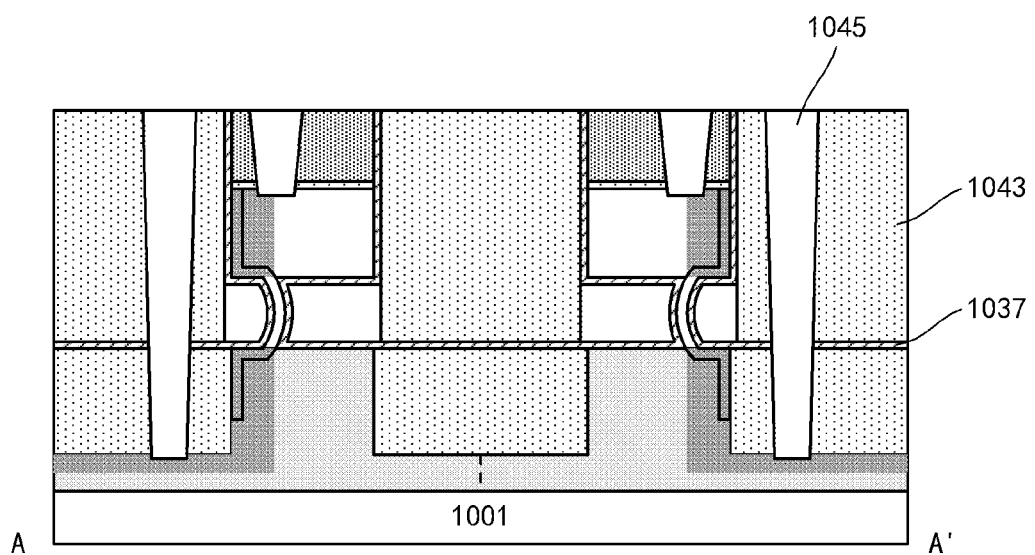

For example, as shown in FIGS. 25(a) and 25(b), a dielectric layer 1043 may be formed on the substrate, for example, through a method of deposition and then planarization. Then, a contact hole may be formed, and the contact hole is filled with conductive materials such as metals to form a contact portion 1045. The contact portion 1045 may include a contact portion penetrating the spacer 1017 and the etching stop layer 1009 and being connected to the upper source/drain portion, a contact portion penetrating the dielectric layer 1043 and the isolation layer 1035 and being connected to the lower source/drain portion, and a contact portion penetrating the dielectric layer 1043 and being connected to the landing pad of the gate conductor layer. As shown in FIGS. 25(a) and 25(b), contact portions connected to the contact areas of the respective lower source/drain portions of the two elements may be located on two opposite sides of the active area (the left side and the right side in the drawing).

Figure 26:
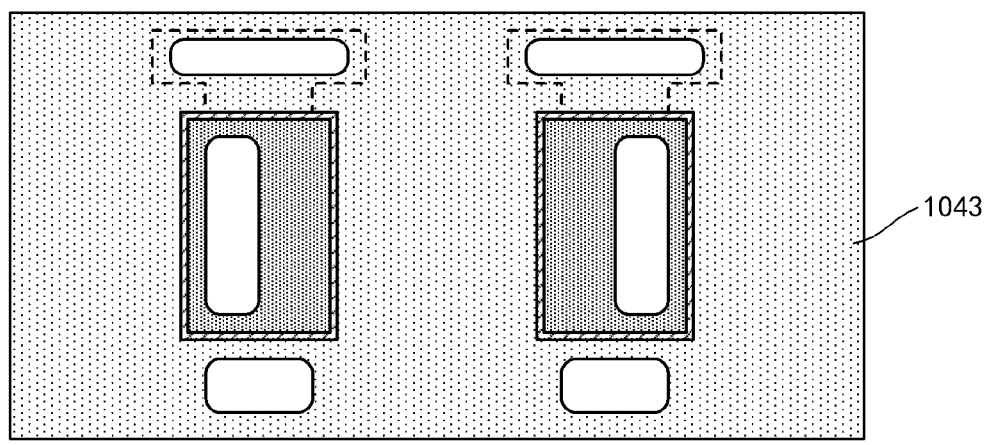
FIG. 26 schematically shows an arrangement of a contact portion according to another embodiment of the present disclosure.

According to other embodiments of the present disclosure, the contact portion connected to the contact area of the lower source/drain portion and the contact portion connected to the landing pad of the gate conductor layer of the respective element may be located on two opposite sides of the active area of the respective element, as shown in FIG. 26.

In the above embodiments, the gate conductor layers 1039p and 1039n are separated from each other. However, the present disclosure is not limited to this. For example, the gate conductor layers 1039p and 1039n may be connected to each other.

Figure 20A:
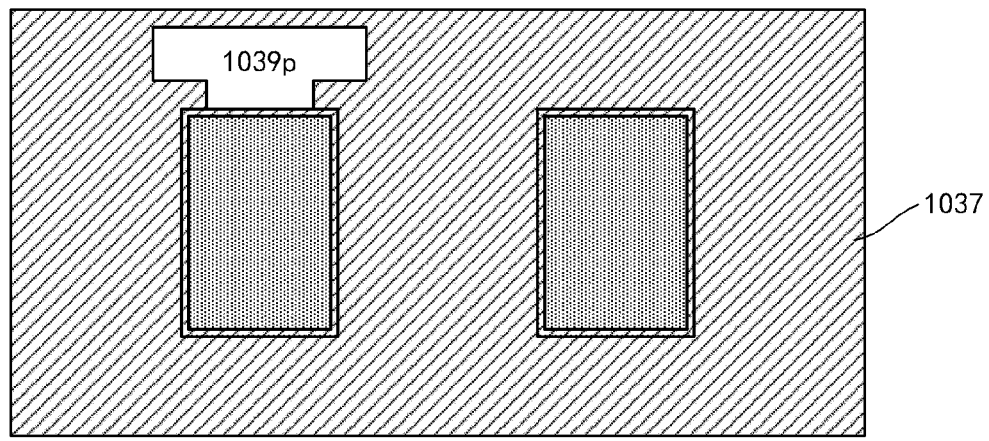
Figure 20B:
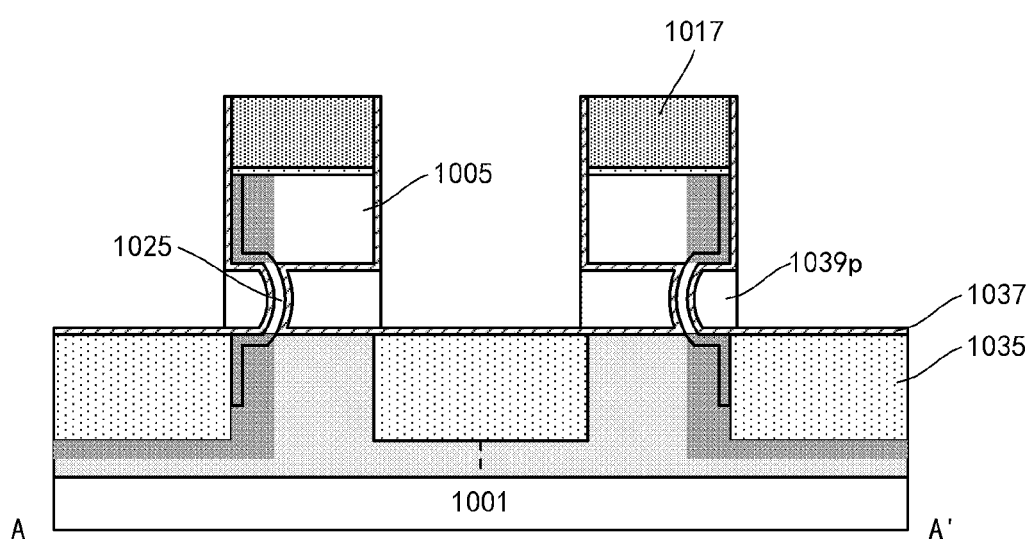
Figure 20C:
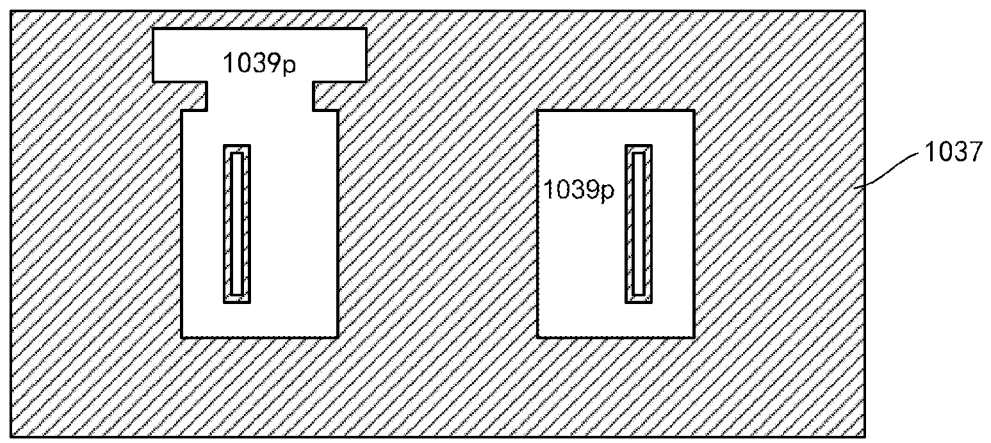

In this case, the photoresist 1041p show in FIG. 19 may not be formed, instead, the processing described in FIGS. 20(a) to 20(c) is performed directly. Therefore, in each one of the p-type element area and the n-type element area, the gate conductor layer 1039p is substantially left below and self-aligned with the spacer 1017. That is, in the p-type element area, the landing pad of the gate contact portion is not formed.

Figure 27:
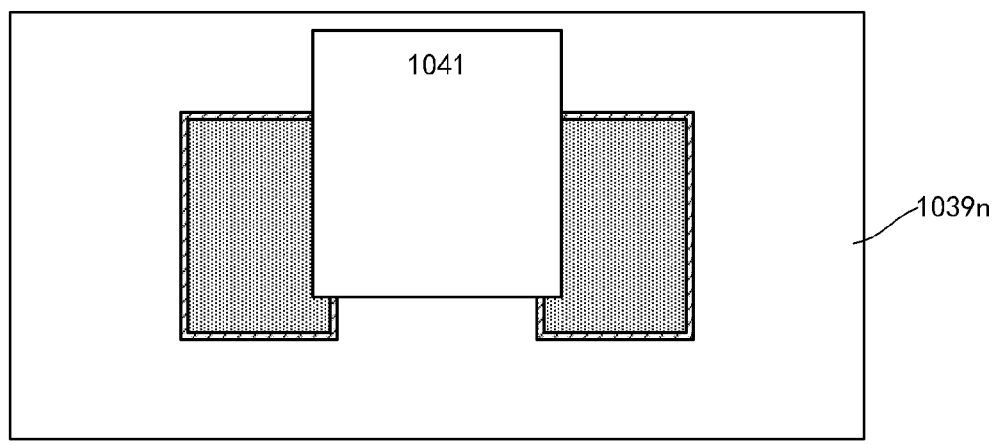
Figure 28:
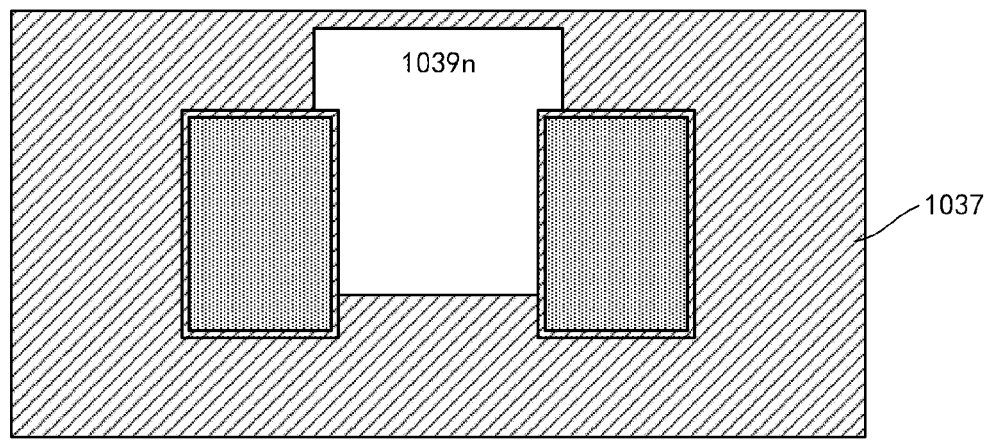

After that, as described above in conjunction with FIGS. 22(a) and 22(b), the gate conductor layer 1039n for the n-type element may be formed. To replace the photoresist 1041n shown in FIG. 23, as shown in FIG. 27, a photoresist 1041 may be formed and patterned to shield a part of an area between the p-type element area and the n-type element area and an area to form the landing pad of the gate contact portion, while other areas are exposed. Then, as shown in FIG. 28, the photoresist 1041 (and the spacer 1017) may be used as the mask to selectively etch the gate conductor layer 1039n, for example, through ME, and the ME may stop at the gate dielectric layer 1037. After that, the photoresist 1041 may be removed.

Therefore, the gate conductor layer 1039n may be continuous between the n-type element and the p-type element, and a portion protruding on one side of the spacer 1017 (the upper side in FIG. 28) is used as the landing pad.

Figure 29A:
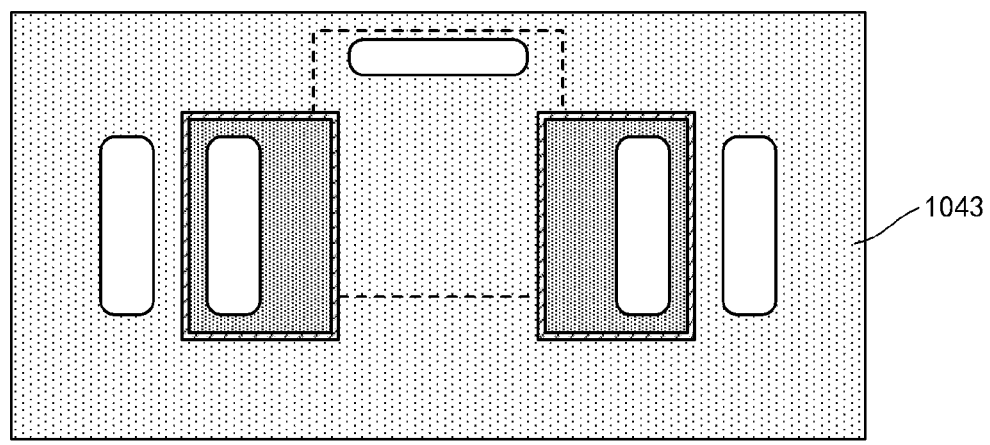
Figure 29B:
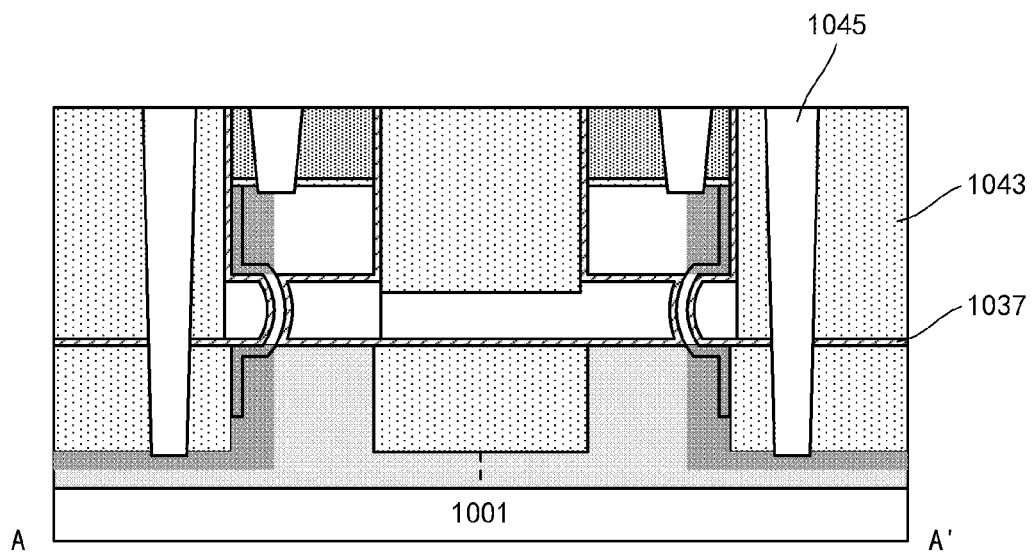

Then, the contact portion may be made similarly. A dielectric layer 1043 may be formed on the substrate, and a contact portion 1045 is formed. As shown in FIGS. 29(a) and 29(b), contact portions connected to the contact areas of the respective lower source/drain portions of the two elements may be located on two opposite sides (the left side and the right side in the drawing) of the active area. The contact portion connected to the gate conductor layer 1039n may be located between the two elements, and is biased toward one side (the upper side in the drawing).

Figure 30:
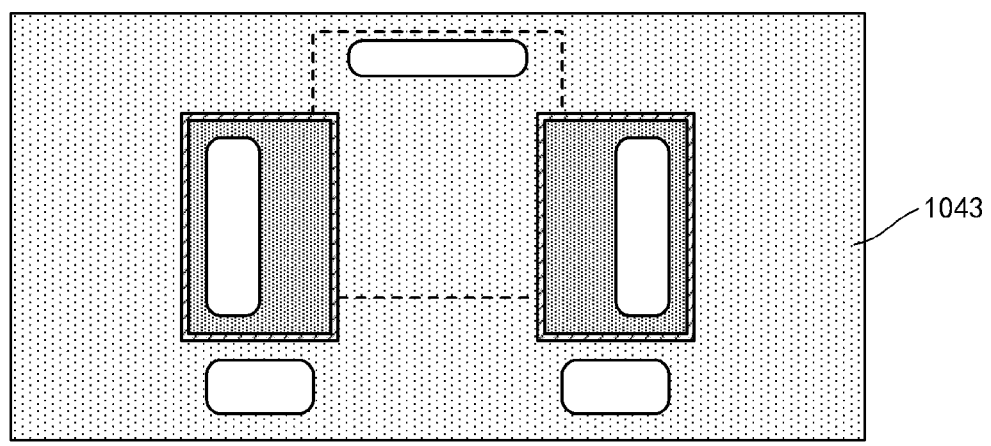
FIGS. 30 and 31 schematically show arrangements of the contact portion according to other embodiments of the present disclosure.
Figure 31:
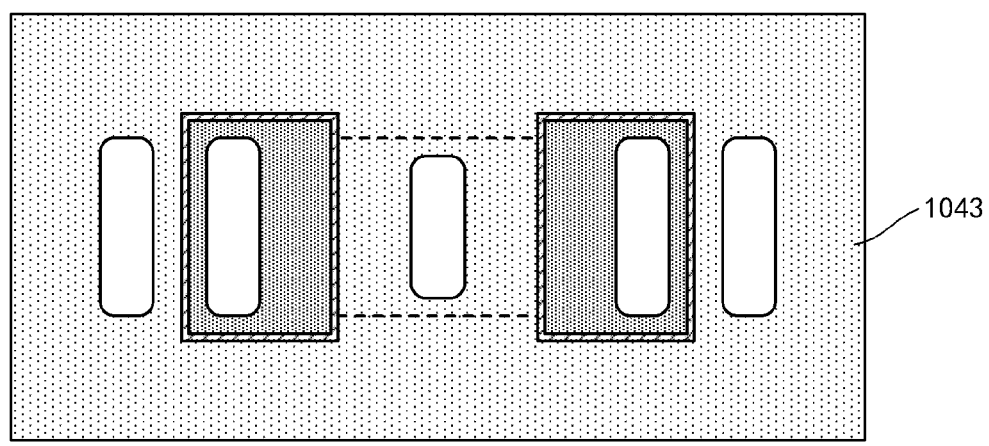

FIGS. 30 and 31 schematically show layouts of the contact portion according to other embodiments of the present disclosure, respectively.

In the layout shown in FIG. 30, the contact portion connected to the gate conductor layer 1039n may be located between the two elements and biased toward one side (the upper side in the drawing), and the contact portions connected to the contact areas of the respective lower source/drain portions of the two elements may be respectively located on the other side of the active area of the corresponding element (the lower side in the drawing). In the layout shown in FIG. 31, the contact portion connected to the gate conductor layer 1039n may be located between the two elements, and the contact portions connected to the contact areas of the respective lower source/drain portion of the two elements may be located on two opposite sides (the left side and the right side in the drawing) of the active area.

The semiconductor device according to the embodiments of the present disclosure may be applied to various electronic apparatuses. For example, it is possible to form an integrated circuit (IC) based on such a semiconductor device, and thereby construct an electronic apparatus. Therefore, the present disclosure also provides an electronic apparatus including the above-mentioned semiconductor device. The electronic apparatus may also include components such as a display screen matched with the integrated circuit and a wireless transceiver matched with the integrated circuit. Such electronic apparatuses include smart phones, computers, tablet computers (PCs), wearable smart apparatuses, mobile power supplies, and so on.

According to the embodiments of the present disclosure, a manufacturing method of a system on chip (SoC) is also provided. The method may include the above-mentioned method. Specifically, a variety of elements may be integrated on the chip, at least some of which are manufactured according to the method of the present disclosure.

In the above description, the technical details such as patterning and etching of each layer have not been described in detail. However, those skilled in the art should understand that various technical means may be used to form layers, areas, etc. of desired shapes. In addition, in order to form the same structure, those skilled in the art may also design a method that is not completely the same as the method described above. In addition, although the respective embodiments are described above respectively, this does not mean that the measures in the respective embodiments may not be advantageously used in combination.

The embodiments of the present disclosure have been described above. However, these examples are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should fall within the scope of the present disclosure.

What is claimed is:

1. A semiconductor device, comprising:
   a first semiconductor element and a second semiconductor element adjacent in a first direction, each of the first semiconductor element and the second semiconductor element comprising:
   a channel portion on a substrate, the channel portion comprising a curved nano-sheet or nano-wire with a C-shaped section, the C-shaped section including a concave sidewall on a first side thereof and a convex sidewall on a second side thereof opposite the first side;
   source/drain portions that are at upper and lower ends of the channel portion with respect to the substrate, respectively; and
   a gate stack surrounding a periphery of the channel portion,
   wherein the channel portion of the first semiconductor element and the channel portion of the second semiconductor element are substantially coplanar.

2. The semiconductor device according to claim 1, wherein at least a part of the gate stack of each of the first semiconductor element and the second semiconductor element adjacent to the corresponding channel portion and the corresponding channel portion are substantially coplanar.

3. The semiconductor device according to claim 1, wherein the respective curved nano-sheets or nano-wires of the first semiconductor element and the second semiconductor element have substantially uniform thicknesses.

4. The semiconductor device according to claim 3, wherein the curved nano-sheet or nano-wire of the first semiconductor element and the curved nano-sheet or nano-wire of the second semiconductor element have a substantially same thickness.

5. The semiconductor device according to claim 1, wherein a size of the source/drain portion of each of the first semiconductor element and the second semiconductor element in a transverse direction with respect to the substrate is larger than a size of the channel portion in the transverse direction.

6. The semiconductor device according to claim 1, wherein the channel portion of each of the first semiconductor element and the second semiconductor element presents a C shape, that is concaved inwardly, at two ends in a second direction intersecting the first direction, respectively.

7. The semiconductor device according to claim 6, wherein the C shape at each of the two ends of the channel portion of the first semiconductor element has a substantially same shape with the C shape at a corresponding end of the channel portion of the second semiconductor element.

8. The semiconductor device according to claim 1, wherein each of the first semiconductor element and the second semiconductor element further comprises:
   a first semiconductor layer and a second semiconductor layer at upper and the lower ends of the channel portion with respect to the substrate, respectively,
   wherein the source/drain portions are provided in the first semiconductor layer and the second semiconductor layer, respectively.

9. The semiconductor device according to claim 8, wherein the first semiconductor layer of the first semiconductor element and the first semiconductor layer of the second semiconductor element are substantially coplanar, and comprise the same material.

10. The semiconductor device according to claim 8, wherein the second semiconductor layer of the first semiconductor element and the second semiconductor layer of the second semiconductor element are substantially coplanar, and comprise the same material.

11. The semiconductor device according to claim 8, wherein the respective source/drain portions of the first semiconductor element and the second semiconductor element are doped areas formed in portions of the respective first semiconductor layer and the second semiconductor layer at one side of an opening of the C shape.

12. The semiconductor device according to claim 11, wherein a doping concentration interface is located between the respective source/drain portions of the first semiconductor element and the second semiconductor element and other portions in the first semiconductor layer and the second semiconductor layer, and the doping concentration interface is substantially in a vertical direction with respect to the substrate.

13. The semiconductor device according to claim 12, wherein the doping concentration interface in the vertical direction between an upper source/drain portion of each of the first semiconductor element and the second semiconductor element and other portions in the first semiconductor layer is substantially aligned with a doping concentration interface in the vertical direction between a lower source/drain portion of each of the first semiconductor element and the second semiconductor element and other portions in the second semiconductor layer.

14. The semiconductor device according to claim 11, wherein, for each of the first semiconductor element and the second semiconductor element, at least a part of a periphery of the gate stack extends along a corresponding periphery of the first semiconductor layer at an upper end of the channel portion.

15. The semiconductor device according to claim 14, wherein, for each of the first semiconductor element and the second semiconductor element, a gate conductor layer in the gate stack further comprises a portion extending beyond the periphery of the first semiconductor layer in a second direction intersecting the first direction to serve as a pad.

16. The semiconductor device according to claim 8, wherein at least one of the first semiconductor element and the second semiconductor element further comprises dielectric layers, the dielectric layers are located at the upper end and the lower end of the channel portion with respect to the substrate, respectively; and the dielectric layers surround at least a part of the periphery of the first semiconductor layer and at least a part of the periphery of the second semiconductor layer, respectively, and wherein the dielectric layers and the corresponding first semiconductor layer are substantially coplanar, or the dielectric layers and the corresponding second semiconductor layer are substantially coplanar.

17. The semiconductor device according to claim 16, wherein, for at least one of the first semiconductor element and the second semiconductor element, at least a part of the periphery of the gate stack extends along the corresponding periphery of both of the first semiconductor layer and the dielectric layer at the upper end of the channel portion.

18. The semiconductor device according to claim 17, wherein, for at least one of the first semiconductor element and the second semiconductor element, the gate conductor layer in the gate stack further comprises a portion extending beyond the periphery of both of the first semiconductor layer and the dielectric layer at the upper end of the channel portion in a second direction intersecting the first direction to serve as a pad.

19. The semiconductor device according to claim 8, wherein, for each of the first semiconductor element and the second semiconductor element, at least an upper portion of a periphery sidewall of the second semiconductor layer at the lower end of the channel portion is substantially aligned with a periphery sidewall of the first semiconductor layer at the upper end of the channel portion.

20. The semiconductor element according to claim 1, wherein the respective channel portions and the respective source/drain portions of the first semiconductor element and the second semiconductor element comprise a single crystal semiconductor material.

21. The semiconductor device according to claim 1, wherein the respective channel portions of the first semiconductor element and the second semiconductor element comprise the same material.

22. The semiconductor device according to claim 1, wherein the respective C shapes of the first semiconductor element and the second semiconductor element are opposite to each other.

23. The semiconductor device according to claim 1, wherein the respective C shapes of the first semiconductor element and the second semiconductor element are symmetric to each other.

24. The semiconductor device according to claim 1, wherein the first semiconductor element is a p-type element, and the second semiconductor element is an n-type element.

25. The semiconductor device according to claim 24, wherein the first semiconductor element and the second semiconductor element form a complementary metal oxide semiconductor configuration.

26. The semiconductor device according to claim 24, wherein the gate stack of the first semiconductor element comprises a first gate conductor layer, and the gate stack of the second semiconductor element comprises a second gate conductor layer separated from the first gate conductor layer.

27. The semiconductor device according to claim 24, wherein the gate stack of the first semiconductor element comprises a first gate conductor layer, the gate stack of the second semiconductor element comprises a second gate conductor layer, and the first gate conductor layer and the second gate conductor layer are connected to each other.

28. The semiconductor device according to claim 24, further comprising:
a first contact portion and a second contact portion that are connected to the respective gate conductor layers of the gate stacks of the first semiconductor element and the second semiconductor element, respectively;
a third contact portion and a fourth contact portion that are connected to the respective upper source/drain portions of the first semiconductor element and the second semiconductor element, respectively, wherein the third contact portion and the fourth contact portion are located above the upper source/drain portions of the first semiconductor element and the second semiconductor element, respectively; and
a fifth contact portion and a sixth contact portion that are connected to the respective lower source/drain portions of the first semiconductor element and the second semiconductor element, respectively.

29. The semiconductor device according to claim 28, wherein,
the gate conductor layers of the gate stacks of the first semiconductor element and the second semiconductor element are separated from each other,
the first contact portion is located on one side of the upper source/drain portion of the first semiconductor element in the second direction intersecting the first direction, and the fifth contact portion is located on one side of the upper source/drain portion of the first semiconductor element away from the second semiconductor element in the first direction, and
the second contact portion is located on one side of the upper source/drain portion of the second semiconductor layer in the second direction, and the sixth contact portion is located on one side of the upper source/drain portion of the second semiconductor element away from the first semiconductor element in the first direction.

30. The semiconductor device according to claim 28, wherein,
the gate conductor layers of the gate stacks of the first semiconductor element and the second semiconductor element are separated from each other,
the first contact portion is located on one side of the upper source/drain portion of the first semiconductor element in the second direction intersecting the first direction, and the fifth contact portion is located on the other side of the upper source/drain portion of the first semiconductor element in the second direction, and
the second contact portion is located on one side of the upper source/drain portion of the second semiconductor layer in the second direction, and the sixth contact portion is located on the other side of the upper source/drain portion of the second semiconductor element in the second direction.

31. The semiconductor device according to claim 28, wherein,
the gate conductor layers of the gate stacks of the first semiconductor element and the second semiconductor element are connected to each other,
the first contact portion and the second contact portion are single shared contact portion,
the fifth contact portion is located on one side of the upper source/drain portion of the first semiconductor element away from the second semiconductor element in the first direction, and
the sixth contact portion is located on one side of the upper source/drain portion of the second semiconductor element away from the first semiconductor element in the first direction.

32. The semiconductor device according to claim 31, wherein, the single shard contact portion is located between the first semiconductor element and the second semiconductor element.

33. The semiconductor device according to claim 28, wherein,
- the gate conductor layers of the gate stacks of the first semiconductor element and the second semiconductor element are connected to each other,
- the first contact portion and the second contact portion are single shared contact portion,
- the single shared contact portion is located between the first semiconductor element and the second semiconductor element, and is biased toward one side of the upper source/drain portions of the first semiconductor element and the second semiconductor element in the second direction intersecting the first direction,
- the fifth contact portion is located on the other side of the upper source/drain portion of the first semiconductor element in the second direction, and
- the sixth contact portion is located on the other side of the upper source/drain portion of the second semiconductor element in the second direction.

34. The semiconductor device according to claim 1, wherein, for at least one of the first semiconductor element and the second semiconductor element, gate lengths of the gate stacks on two opposite sides of the C-shaped curved nano-sheet or nano-wire are substantially equal to each other.

35. An electronic apparatus, comprising the semiconductor device according to claim 1.

36. The electronic apparatus according to claim 35, comprising at least one of smart phones, computers, tablet computers, wearable smart apparatuses, artificial intelligence apparatuses, or portable power supplies.

* * * * *